United States Patent

Van Rompuy et al.

Patent Number: 5,413,897

Date of Patent: * May 9, 1995

[54] SILVER HALIDE PHOTOGRAPHIC MATERIAL

[75] Inventors: Ludo L. Van Rompuy, Destelbergen; Jean-Marie O. Dewanckele, Drongen; Jos A. Vaes, Betekom; Marcel J. Monbaliu, Mortsel, all of Belgium

[73] Assignee: AGFA-Gevaert, N.V., Mortsel, Belgium

[ * ] Notice: The portion of the term of this patent subsequent to Jun. 28, 2011 has been disclaimed.

[21] Appl. No.: 238,047

[22] Filed: May 4, 1994

Related U.S. Application Data

[63] Continuation of Ser. No. 921,088, Jul. 29, 1992, Pat. No. 5,324,622.

[30] Foreign Application Priority Data

Aug. 13, 1991 [EP] European Pat. Off. ............ 91202061

[51] Int. Cl.$^6$ ............................ G03C 5/54; G03C 1/10
[52] U.S. Cl. ..................................... 430/230; 430/204; 430/234; 430/509; 430/598; 430/600; 430/603
[58] Field of Search ............... 430/204, 230, 234, 251, 430/509, 598, 600, 603, 202, 455, 955, 617, 599

[56] References Cited

U.S. PATENT DOCUMENTS

| | | | |
|---|---|---|---|
| 4,358,528 | 11/1982 | Takagi et al. | 430/251 |
| 4,518,682 | 5/1985 | Kobayashi et al. | 430/543 |
| 4,693,955 | 9/1987 | Torizuka et al. | 430/230 |
| 4,724,199 | 2/1988 | Kobayashi et al. | 430/955 |
| 4,772,535 | 9/1988 | Yamano et al. | 430/230 |
| 5,068,165 | 11/1991 | Coppens et al. | 430/204 |
| 5,073,473 | 12/1991 | Koya et al. | 430/234 |
| 5,324,622 | 6/1994 | Van Rompuy et al. | 430/204 |

*Primary Examiner*—Richard L. Schilling
*Attorney, Agent, or Firm*—Breiner & Breiner

[57] ABSTRACT

The present invention provides a photographic material comprising on a support (i) photosensitive silver halide particles, (ii) substantially light insensitive silver salt particles having a speed at least a factor 10 less than said photosensitive silver halide particles under the same conditions of exposure and development of said photosensitive silver halide particles and (iii) a releasing compound capable of image-wise releasing under the conditions for image-wise development of said photosensitive silver halide to silver a chemical sensitizer, said chemical sensitizer rendering said substantially light insensitive silver salt particles developable. The present invention also provides a method for making an image therewith and a method for making a lithographic printing plate.

6 Claims, No Drawings

SILVER HALIDE PHOTOGRAPHIC MATERIAL

This is a continuation of application Serial No. 07/921,088, filed Jul. 29, 1992, now U.S. Pat. No. 5,324,622.

FIELD OF THE INVENTION

The present invention relates to a photographic material and a method for producing images therewith.

BACKGROUND OF THE INVENTION

In the art of silver halide photography it is well known to use compounds that image-wise release a photographic useful group such as e.g. a dye or dye precursor, a silver halide solvent, a fogging agent, an antifogging agent, a development inhibitor, a development accelerator, a developing agent, a chemical or spectral sensitizing agent, a toning agent etc. Some of these type of compounds are commonly employed to produce colour images (see for example Angew. Chem. Int. Ed. Engl. 22 pages 191-209, 1983) but are also useful in black and white materials to obtain a photographic material having a high speed, high contrast etc. For example U.S. Pat. No. 4,724,199 discloses compounds capable of releasing a fogging agent to obtain a photographic material of high speed and high contrast.

Some of these type of compounds may also be used to obtain a negative working silver salt diffusion transfer material. See for example U.S. Pat. No. 4,693,955 and the Japanese published unexamined patent application no. 15247/59. By the term "negative working" is meant that the exposed parts of the photographic material yield the image parts while the term "positive working" implies the formation of image parts corresponding to the non-exposed parts of the photographic material.

SUMMARY OF THE INVENTION

It is an object of the present invention to provide a new type of photographic material of high speed and good contrast.

It is a further object of the present invention to provide a method for obtaining an image with said photographic material.

It is a third object of the present invention to provide a method for making a negative or positive working lithographic printing plate based on the silver salt diffusion transfer process using said photographic material.

Further objects will become clear from the description hereinafter.

According to the present invention there is provided a photographic material comprising on a support photosensitive silver halide particles, and substantially light insensitive silver salt particles having a speed at least a factor 10 less under the same conditions of exposure and development of said photosensitive silver halide particles than said photosensitive silver halide particles and a releasing compound capable of image-wise releasing under conditions for image-wise developing said photosensitive silver halide particles to silver a chemical sensitizer said chemical sensitizer rendering said substantially light insensitive silver salt particles developable.

According to the present invention there is also provided a method for making an image using the photographic material defined above.

According to the present invention there is also provided a method for making a negative or positive working lithographic printing plate using the photographic material defined above.

DETAILED DESCRIPTION OF THE INVENTION

In the method of the present invention during the development step a chemical sensitizer rendering the substantially light insensitive silver salt particles developable is released either mainly in the exposed or mainly in the non-exposed areas.

According to a first embodiment of the present invention compounds that preferably release the chemical sensitizer in their reduced state can be incorporated in the photographic material in their reduced state. Thus for a negative working photosensitive silver halide emulsion during development the developing agent will be oxidized in the exposed areas and will be able to oxidize the releasing compound in the exposed areas. In the non-exposed areas the developing agent will remain in its reduced state thus not being able to oxidize the releasing compound. Since the reduced form of the releasing compound according to this first embodiment preferably releases the chemical sensitizer under the conditions of development of the photosensitive silver halide the chemical sensitizer will be mainly released in the non-exposed areas thus rendering the substantially light insensitive silver salt particles developable in the non-exposed areas. Therefore in the exposed areas only the photosensitive silver halide will be developed while in the non-exposed areas the substantially light insensitive silver salt particles will be developed and probably also the photosensitive silver halide. Since the combination of the photosensitive silver halide and substantially light insensitive silver salt can be choosen such that mainly the substantially light insensitive silver salt contributes to building up of density e.g. by using more light insensitive silver salt than photosensitive silver halide or by using a coarse grain photosensitive silver halide and a fine grain light insensitive silver salt the density in the exposed parts will be less than in the non-exposed parts.

According to a second embodiment the releasing compound can be incorporated in its oxidized state and mainly the reduced form of the releasing compound is capable of releasing the chemical sensitizer. During development of a negative working photosensitive silver halide emulsion the developing agent will be consumed in the exposed areas due to development of the exposed silver halide and as a consequence the releasing compound mainly remains in its oxidized state in the exposed areas. In the non-exposed areas the releasing compound will be reduced by the developing agent so that the release of the chemical sensitizer in the non-exposed areas will be enabled under the conditions of development. As a consequence the chemical sensitizer will be mainly released in the non-exposed areas where it renders the substantially light insensitive silver salt particles developable. Simalar as explained in the first embodiment this will result in a larger density in the non-exposed parts than in the exposed parts.

According to a third embodiment of the present invention a releasing compound capable of preferably releasing in its oxidized form the chemical sensitizer is incorporated in the oxidized state. During development the developing agent will be consumed in the exposed areas of a negative working photosensitive silver halide emulsion due to development of the exposed silver halide so that the releasing compound remains in the oxidized state in the exposed areas and will be reduced in the non-exposed areas by the developing agent. As a consequence the chemical sensitizer will be mainly released in the exposed areas where the chemical sensitizer will render the light insensitive silver salt particles developable. In this embodiment none or pratically none of the silver halide and silver salt in the non-exposed areas will be developed while both the photosensitive silver halide and substantially light insensitive silver salt in the exposed areas will be developed. This embodiment and the subsequent fourth and fifth embodiment that operate in a similar way offer the advantage over a silver halide material containing no releasing compound and substantially light insensitive silver salt that high speed photosensitive materials can be obtained without loss of image quality especially the image density.

According to a fourth embodiment of the present invention a releasing compound capable of preferably releasing in its oxidized form the chemical sensitizer is incorporated in the reduced state. During development the developing agent will be oxidized in the exposed areas of a negative working photosensitive silver halide emulsion due to development of the exposed silver halide so that the oxidized form of the developing agent will be capable of oxidizing the releasing compound to its oxidized state in these areas while the releasing compound will remain in its reduced state in time non-exposed areas. As a consequence the chemical sensitizer will be mainly released in the exposed areas where the chemical sensitizer will render the light insensitive silver salt particles developable, According to a fifth embodiment of the present invention releasing compounds can be used that release the chemical sensitizer compound upon a coupling reaction with the oxidized form of the developing agent to release the chemical sensitizer. During development the developing agent will be oxidized in the exposed parts of a negative working photosensitive silver halide emulsion so that in these areas a coupling reaction of the oxidized form of a developing agent with the releasing compound can take place. As a consequence the substantially light insensitive silver salt particles will be rendered developable in the exposed parts of the photographic material.

According to a sixth embodiment of the present invention a releasing compound can be used that releases the chemical sensitizer under the developing conditions upon reaction with silver ions. Since the silver ions are developed to silver in the exposed parts of a negative working photosensitive silver halide emulsion the reaction will mainly take place in the non-exposed areas of the photosensitive silver halide emulsion so that the sensitizer will be released in the non-exposed areas.

Depending upon the type of releasing compound and the releasing mechanism it is thus possible to manufacture a negative or positive working photographic material comprising a negative working photosensitive silver halide emulsion. It is further clear to a person skilled i n the art that when a positive working photosensitive silver halide emulsion is used the release of the chemical sensitizer will take place in areas opposite in image value with regard to the areas where release takes place in the negative working emulsions.

Releasing compounds suitable for use in accordance with the present invention correspond to general formula (A) or (B):

CAR-(TIME)$_n$-Q  (A)

wherein CAR represents a carrier moiety that upon reaction with either the reduced or oxidized form of a developing agent or upon reaction with silver ions is capable of releasing under the conditions for development of the photosensitive silver halide the moiety -(TIME)$_n$-Q, TIME represents a so called timing group which releases Q subsequent to the release of -(TIME)$_n$-Q from CAR, Q represents a chemical sensitizer capable of rendering silver salt particles developable and n represents 0 or 1;

  (B)

wherein CAR has the same meaning as defined above, x represents an integer from 2 to 20, Y represents S, Se or Te and Z represents the necessary atoms to form together with Y$_x$ and CAR a ring.

A variety of reactions for releasing a compound under silver halide developing conditions from a carrier moiety are known in the prior art. Such reactions for releasing and carrier moieties suitable for use in accordance with the present invention are disclosed in e.g. "Dye diffusion systems in colour photography" Angew. Chem. Int. Ed. Engl. 1983 volume 22 pages 191–209 and references cited therein, U.S. Pat. No. 4,916,047, Japanese published unexamined patent applications no. 271345/63 and 287857/63, EP 198,438 and EP 347,849.

Preferably used releasing reactions are e.g. a redox reaction of the developing agent with the carrier moiety or a coupling reaction of the oxidized form of the developing agent with the carrier moiety.

Preferably used carrier moieties for use in a redox reaction with the developing agent are shown in table 1.

TABLE 1

Carriers for use in a redox reaction with the developing agent.

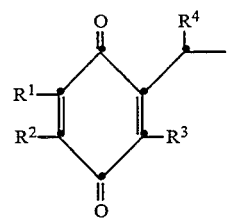 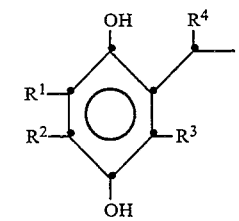

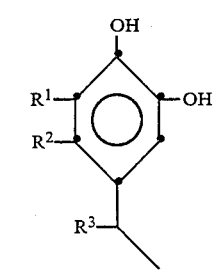 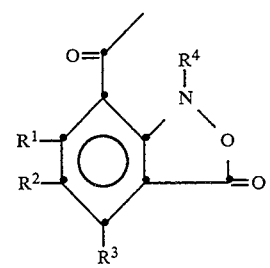

TABLE 1-continued
Carriers for use in a redox reaction with the developing agent.

TABLE 2
Carriers for release upon a coupling reaction with the oxidized form of a developing agent

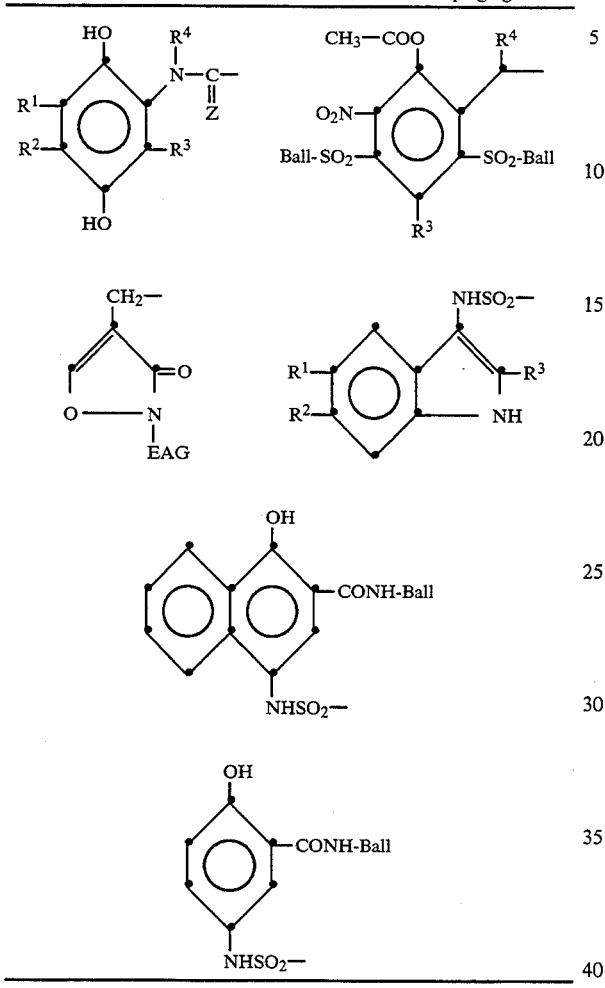
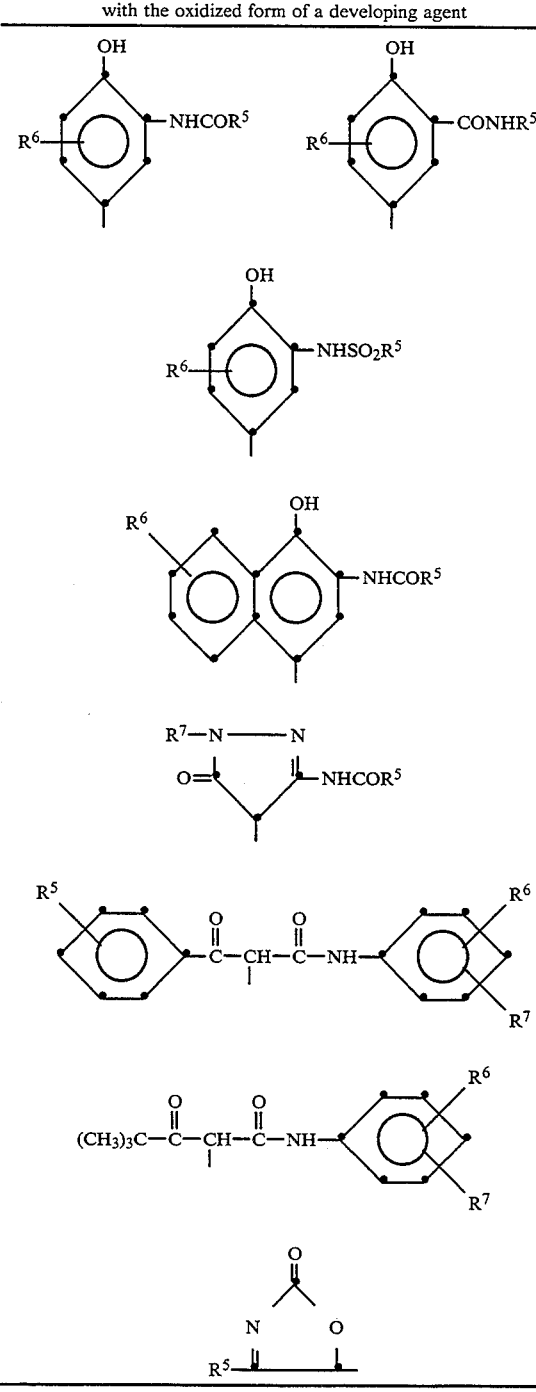

In the above formulas each of $R^1$, $R^2$, $R^3$ independently represents an alkyl group, an arylalkyl group, an alkylaryl group or an aryl group each of which may be substituted, an alkyloxy or a halogen atom. $R^1$ and $R^2$ may be linked to each other to form a ring, $R^4$ has one of the significances given for $R^1$ or represents hydrogen, Ball represents a ballast group well known in the art e.g. the ballast groups disclosed in U.S. Pat. Nos. 3,358,700, 4,266,019, 4,232,312, 4,513,082, 3,894,895, 3,664,841, Z represents O or S and EAG represents an electron accepting group e.g. those disclosed in U.S. Pat. No. 4,916,047, Japanese published unexamined patent applications no. 271345/63 and 287857/63.

Preferred carrier moieties for use in a coupling reaction with the oxidized form of a developing agent are e.g. acylacetamides such as benzoylacetanilides and pivalylacetanilides, cyclic carbonyl containing compounds, pyrazolones, pyrazolotriazoles, phenols and naphtols etc.. Specific examples a reshown in table 2.

In the above formulas each of $R^5$ and $R^7$ independently represents a hydrogen, a ballast group, an alkyl, arylgroup or alkoxy group each of which may be substituted and $R^6$ represents one or more substituents selected from halogen, an alkyl or alkoxy having 1 to 4 carbon atoms.

Suitable timing groups for use in accordance with the present invention are disclosed in e.g. EP 403019 and EP 347849. Specific examples of timing groups are shown in table 3.

TABLE 3

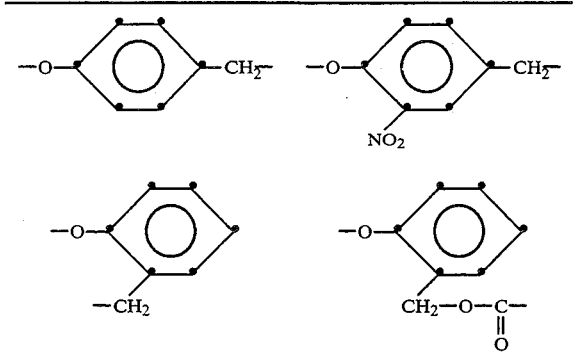

Examples of moieties Q capable of rendering a silver salt emulsion developable after release from the carrier moiety for use in accordance with the present invention are shown in table 4. Further moieties Q suitable for use in accordance with the present invention are disclosed in e.g. U.S. Pat. No. 4,518,682.

TABLE 4

$-Y_x-(TIME)_t-CAR'$ wherein x and Y have the same meaning as defined above, t may be 0 or 1 and CAR' has one of the significance given for CAR

TABLE 4-continued defined above and may be the same as CAR but may also differ from CAR provided that both CAR and CAR' react in the same manner $-Y_x-R^8$ wherein x and Y have the same meaning as defined above and $R^8$ represents an alkyl, an aryl, an alkylaryl or acyl group each of which may be substituted, $-S-SO_2-R^8$ wherein $R^8$ has the same meaning as defined above $$-L-\overset{S}{\underset{\|}{C}}-NR^9R^{10}$$

wherein each of $R^9$ and $R^{10}$ independently represent hydrogen, an alkyl or aryl or acyl group that may be substituted, L represents a divalent linking group e.g. $-SO-$, $-SO_2-$, $-S-$, $-O-$, $-CO-$, an ester, an amide, an amine, a carbonate, an alkylene, an alkenylene, an arylene etc.

$$-L-\overset{S}{\underset{\|}{C}}-\overset{S}{\underset{\|}{C}}-NR^9R^{10}$$

wherein L, $R^9$ and $R^{10}$ have the same meaning as defined above

Examples of compounds corresponding to general formula (A) or (B) are shown in table 5. Other compounds suitable for use in accordance with the present invention are disclosed in e.g. U.S. Pat. No. 4,518,682.

TABLE 5 compounds corresponding to formula (A)

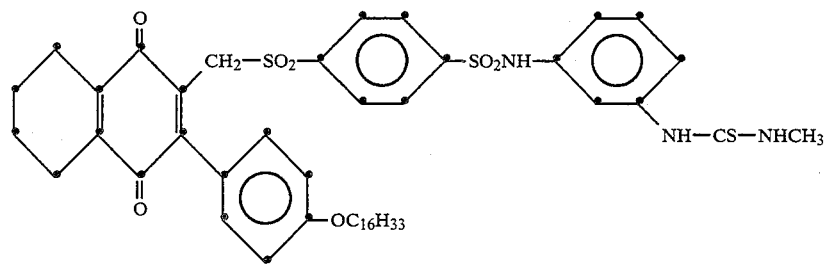

1A

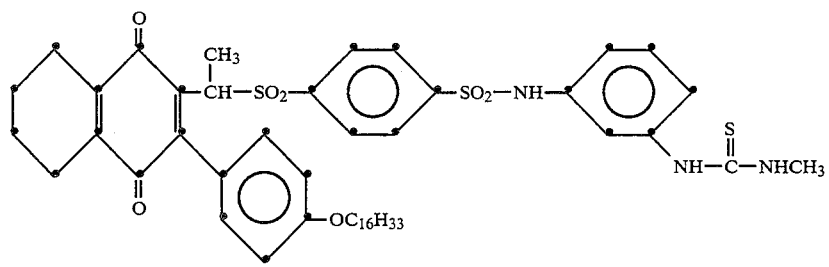

2A

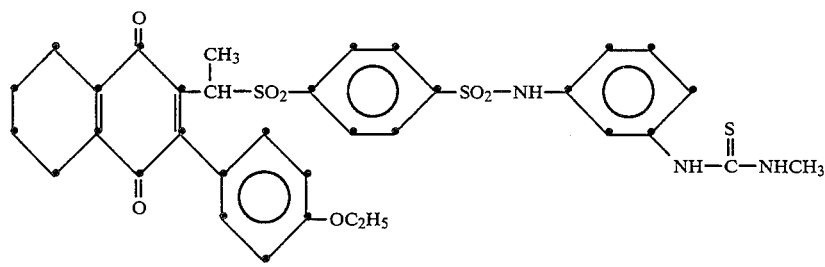

3A

TABLE 5-continued
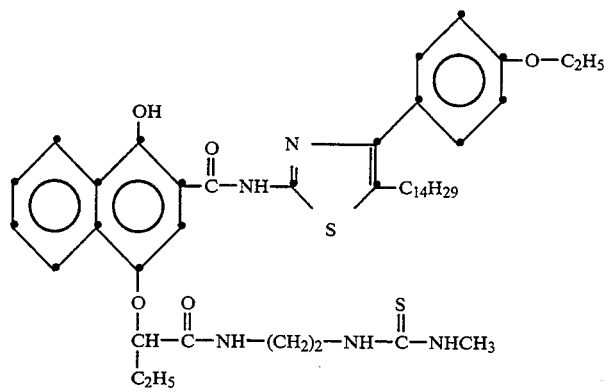
4A
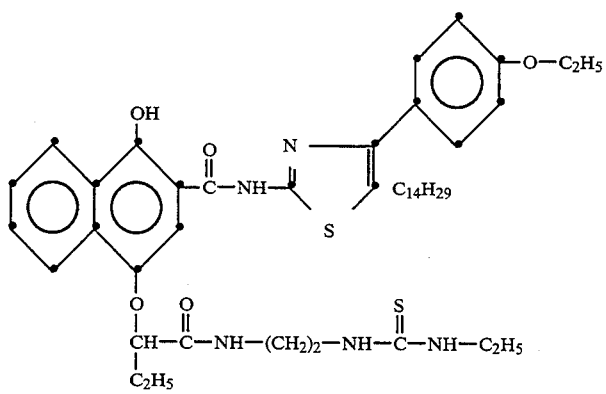
5A
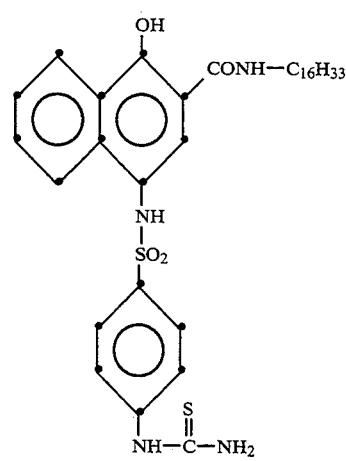
6A
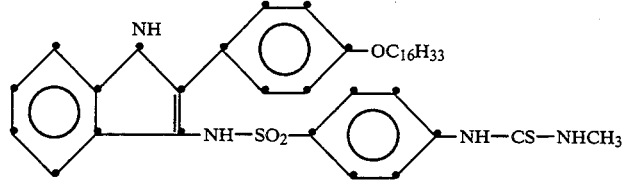
7A
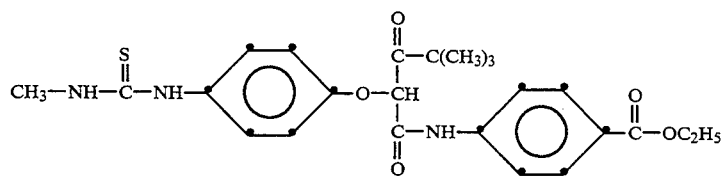
8A TABLE 5-continued
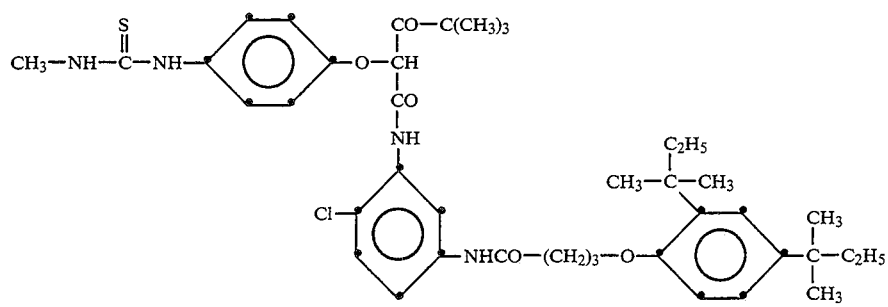
9A
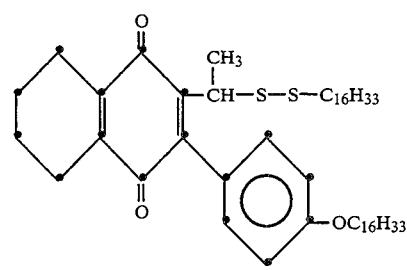
10A
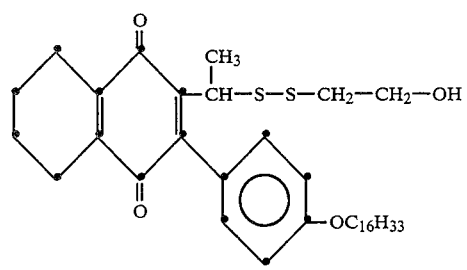
11A
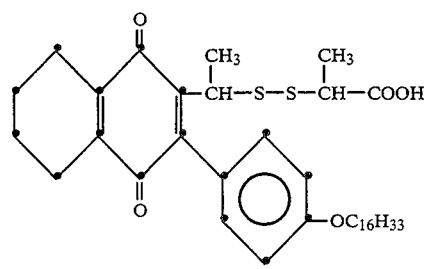
12A
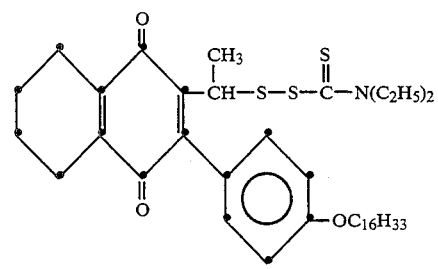
13A
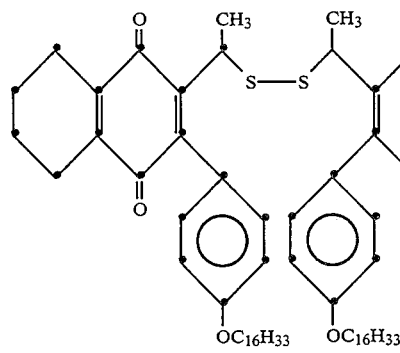
14A
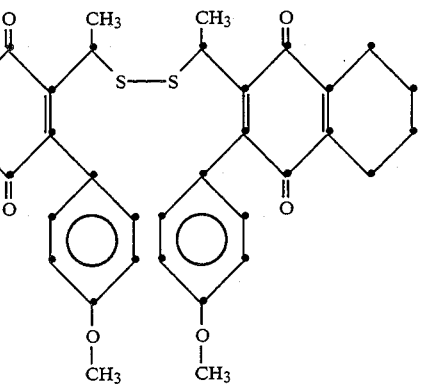
15A
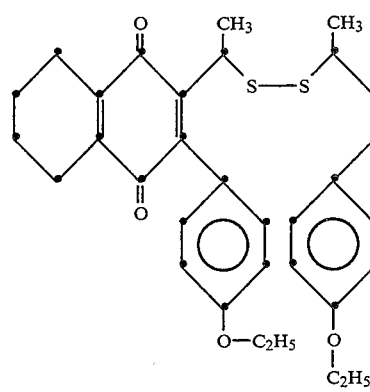
16A
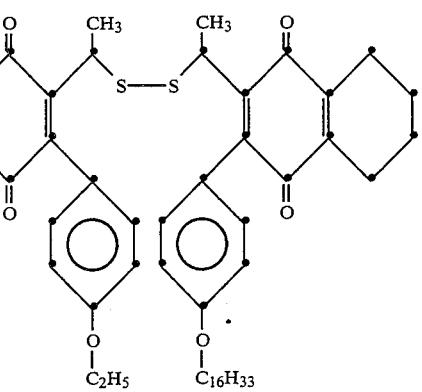
17A TABLE 5-continued
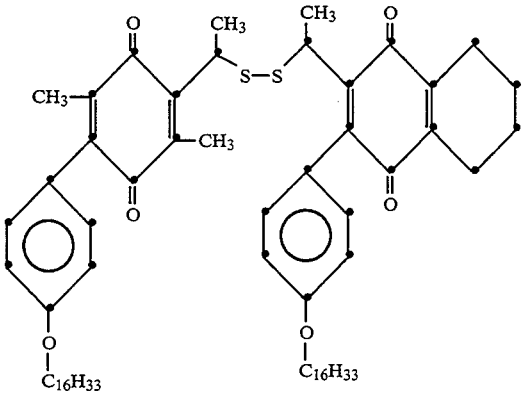
18A
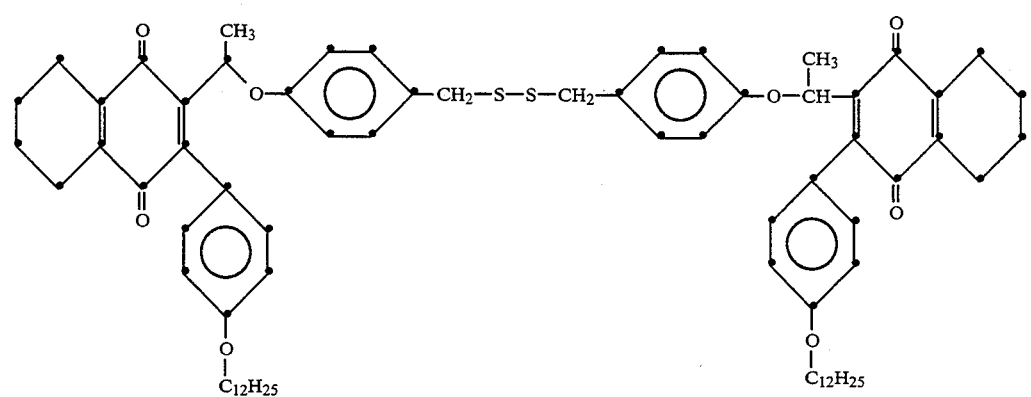
19A
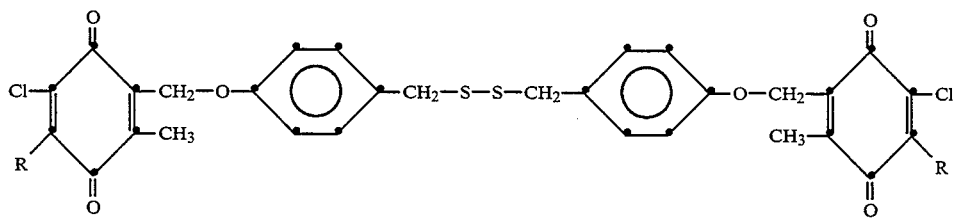
20A
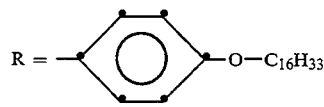
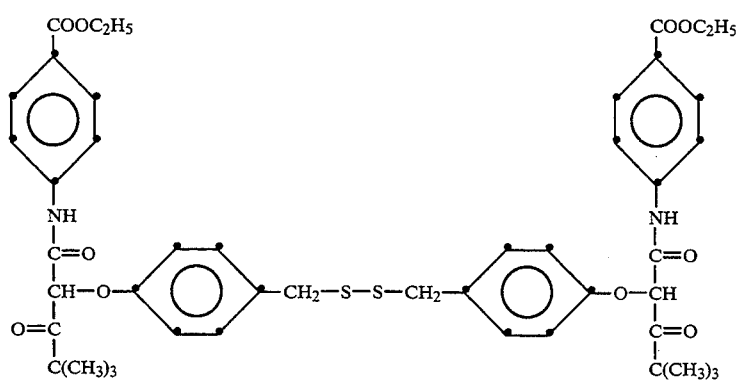
21A
Examples of Formula (II)

TABLE 5-continued
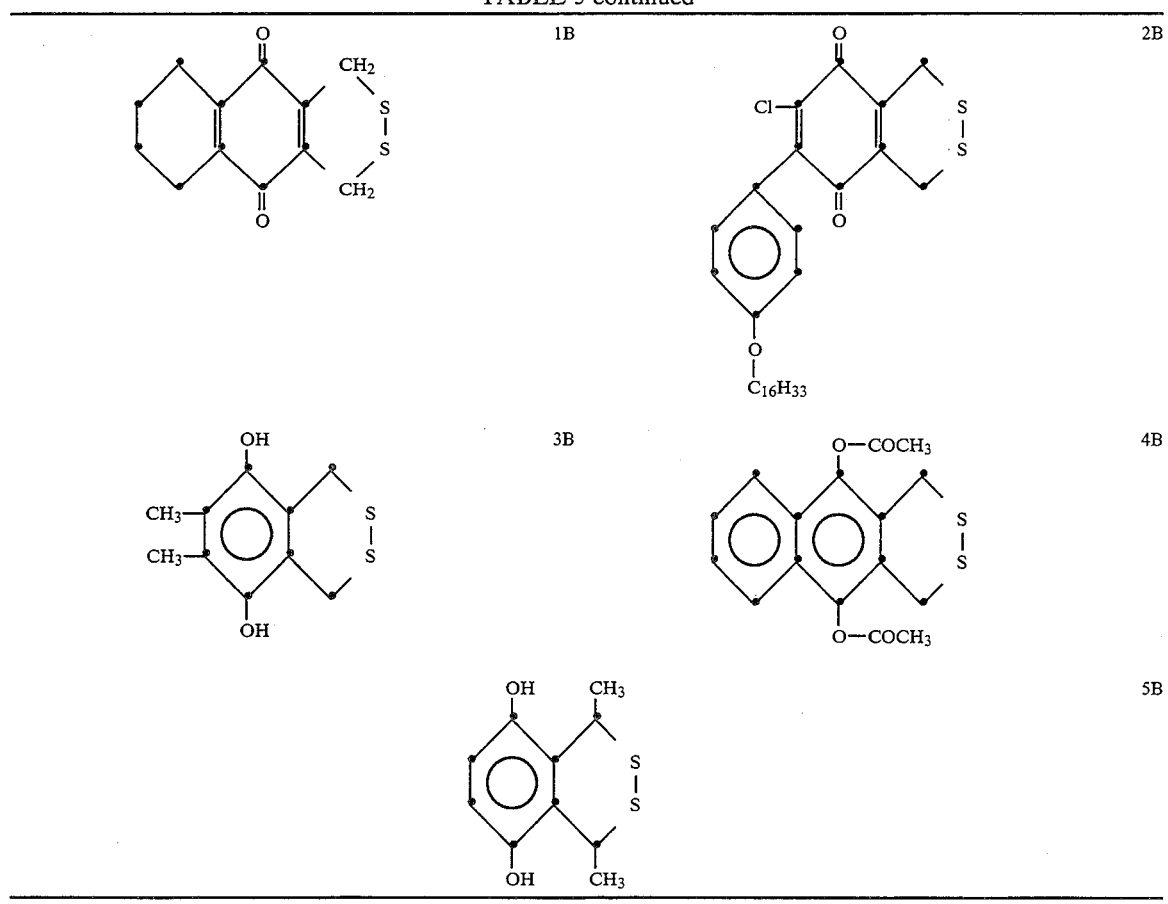
Compounds 1A to 3A can be prepared according to the following scheme (I):
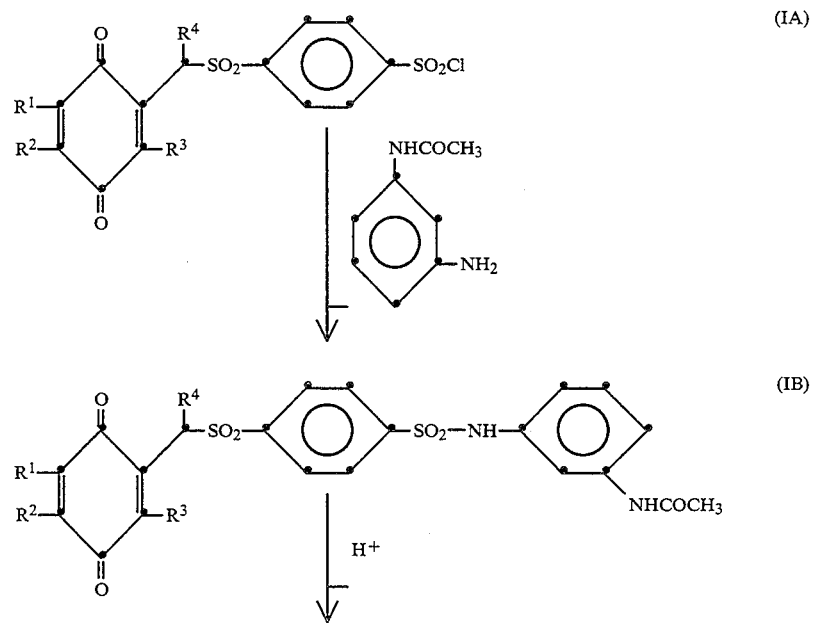

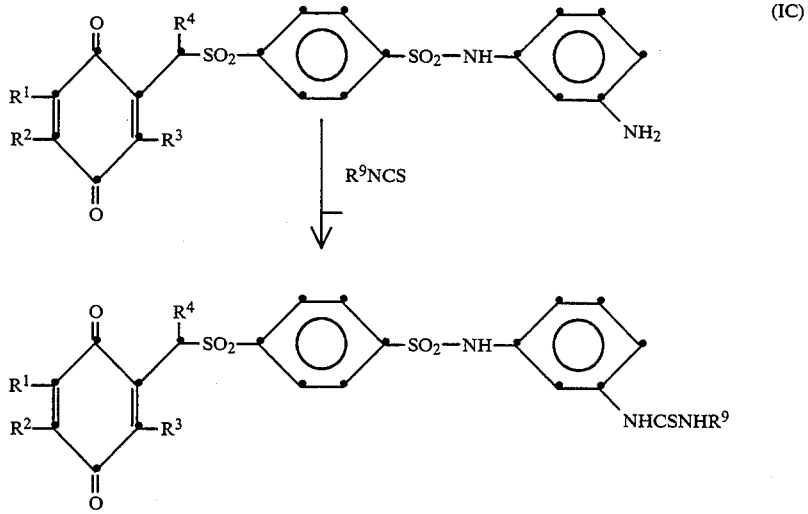

(IC)

wherein $R^1$, $R^2$, $R^3$, $R^4$ and $R^9$ have the same meaning as defined above.

The procedure according to scheme (I) is exemplified by the following preparation of compound 2A ($R^1$ and $R^2$ together forming a cyclohexane, $R^3$ being —$C_6H_5$—O—$C_{16}H_{33}$, $R^4$ and $R^9$ being $CH_3$).

Preparation of compound (IB)

To a solution of 37.5 g of m-aminoacetanilide in 375 ml of pyridine was added 186 g of compound (IA) (for the preparation of (IA) see e.g. EP-A-173361). The suspension was stirred for two hours at 50° C. Then the reaction was poured on 3.5 l of a hydrogen chloride solution (2N) which was ice cooled. The resulting precipitate was dissolved in 1.2 l of toluene and extracted with 500 ml of a 1N solution of hydrogen chloride and subsequently with 500 ml of water. The product was crystallised from 1.5 l of hexane. (yield: 204 g; melting point: 221° C.)

Preparation of compound (IC)

To a solution of 42.9 g of compound (IB) in 600 ml of 1-methoxy-propan-2-ol and 60 ml of water was added 120 ml of HCl (12N). The solution was refluxed for 30 min. and subsequently cooled to 50° C. The mixture was then carefully poured on a solution of 150 g of NaHCO₃ in 2 l of water. The precipitate formed was filtered and dried. The product was chromatographically purified (SiO₂, eluent: dichloromethane/methanol 95:5). (yield: 11.5 g; melting point: 81.9° C.)

Preparation of compound 2A

To a solution of 4.1 g of compound (IC) in 5 ml of acetonitrile was added 1.82 g of methylisothiocyanate. The reaction was stirred for 7 days at room temperature. The solvent was evaporated and the product was chromatographically purified (SiO₂, eluent: dichloromethane/ethylacetate 85:15 ). (yield: 2.5 g; melting point 101.2° C.).

Compound 4A can be prepared according to the following scheme

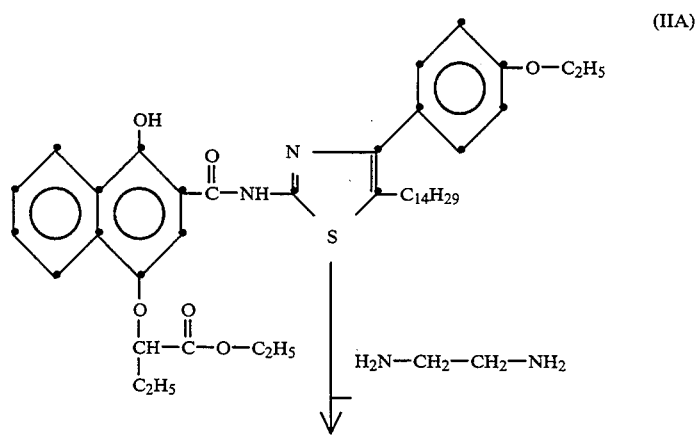

(IIA)

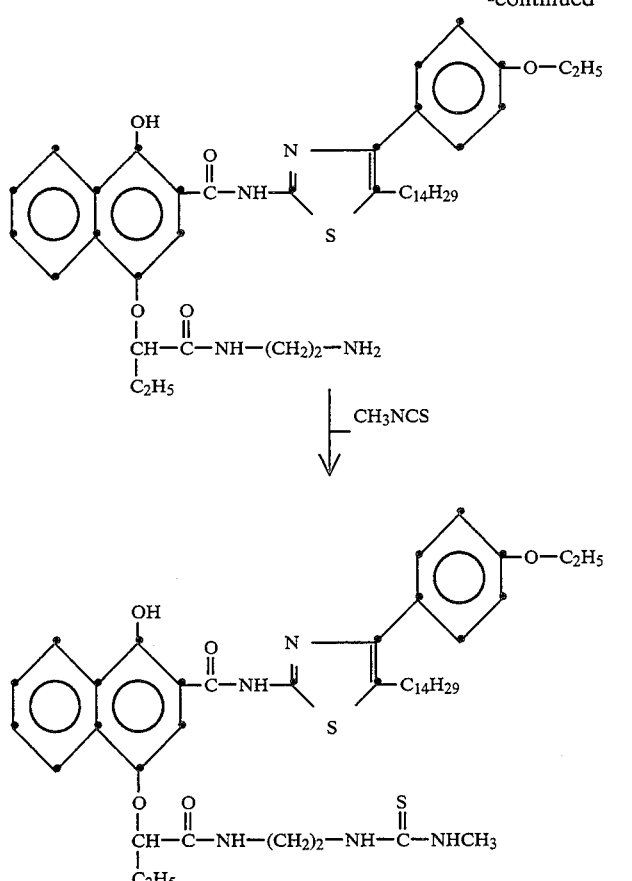

Compound 5A can be prepared according to a similar procedure. The preparation of compound 4A according to scheme (II) is as follows:

Preparation of compound (IIB)

A solution of 35.8 g of compound (IIA) in 150 g of ethylenediamine was stirred for 5 hours at room temperature. The solution was then poured in a mixture of ice-water and acetic acid. The precipitate which formed was filtered and washed with water and finally dried.

Preparation of compound 4A

A solution of 7.3 g of compound (IIB) and 1.1 g of methylisothiocyanate in 50 ml of tetrahydrofuran is refluxed for 1 hour and subsequently cooled and poured in water. The precipitate which formed was filtered and recrystallised from 2-methoxyisopropanol.

Compound 6A can be prepared as follows:

2.9 g of 2-stearylamido-4-(p-amino-benzenesulfonamido)-naphthol was brought in 48 ml of toluene and 8 ml of the mixture was removed by azeotropic destillation. The mixture was then cooled to 80° C. and 0.43 g of Si(NCS)$_4$ was added. The mixture was stirred for 1 hour at 80° C. and a same amount of Si(NCS)$_4$ was subsequently added. The mixture was then stirred for another 2 hours at 80° C. and left to stand overnight. The solvent was then removed and the remaining residue redissolved in a mixture of 90 ml of isopropanol and 10 ml of water. This solution was subsequently filtered to remove the SiO$_2$ which formed during the reaction. The solvent of the filtrate was removed and compound 6A was obtained as a yellow powder.

Compound 7A can be prepared according as follows:

134.7 g of 2-(4-stearyloxyphenyl)-3-amino-indole and 85 g of p-chlorosulfonylacetanilide were brought in 1 l of aceton. Whilst stirring 49 ml of pyridine were added and the mixture was subsequently refluxed for 8 hours. The obtained reaction mixture was cooled and poured in an 1 mol/l aqueous solution of HCl. A precipitate was obtained which was filtrated, washed and dried. 190 g of the obtained precipitate was dissolved in 1.3 l of ethanol and 125 ml of an aqueous HCl solution (7.5 mol/l) were dropwise added during a period of 20 min. The obtained mixture was refluxed for 8 hours and subsequently cooled to 35° C. A precipitate was formed which was filtrated and washed with 100 ml of ethanol. The precipitate was then stirred in a mixture of 1 of ethylacetate, 35 ml of 25% aqueous NH$_4$OH solution and 500 ml of water. The ethylacetate layer was then separated and the ethylacetate solvent was subsequently removed under reduced pressure. A solution of 15.1 g of the thus obtained residue and 7.32 g of methyl isothiocyanate in tetrahydrofuran was stirred for 10 days at room temperature. Compound 7A was obtained as a precipitate and recrystallized from acetonitrile. The melting point was 143° C.

Compound 8A was prepared as follows:

Preparation of α-pivaloyl,α-(4-nitrophenoxy)-(4-carbethoxy)acetanilide.

A solution of 21,9 g of p-nitro-phenol and 37.5 ml of tetramethyl guanidine in 250 ml of acetonitrile was added to a solution of 48.8 g of α-chloor,α-pivaloyl(4-carbethoxy)acetanilide and the resulting mixture was stirred for 3 hours at 40° C. The reaction mixture was then neutralized with 30 ml of HCl (5N) en diluted with 250 ml of water. A precipitate formed which was separated and recrystallized from acetonitrile.

Preparation of α-pivaloyl,α-(4-aminophenoxy)-(4-carbethoxy)acetanilide. In 128 ml of 2-methoxyisopropanol were dissolved 12.85 g of α-pivaloyl,α-(4-nitrophenoxy)-(4-carbethoxy)acetanilide, 3.82 g of piperidine and 0.3 ml of a Raney Nickel suspension. To this solution was guided hydrogen gas at a pressure of 3 bar during 3 hours. The solids in the mixture were removed and the solution was evaporated. The yellow oil obtained was dissolved in dichloromethane, washed with water and the dichloromethane was subsequently removed under reduced pressure. The resulting oil was crystallized in toluene.

Preparation of compound 8A

A solution of 9.95 g of α-pivaloyl,α-(4-aminophenoxy)(4-carbethoxy)acetanilide and 2.8 g of methylisothiocyanate in 75 ml of tetrahydrofuran was refluxed for 2 hours. To the mixture was then added 275 ml of n-hexane whilst stirring. An oil formed and the liquid was decanted. The oil was further stirred with hexane untill it solidified.

Compound 9A was prepared in a similar way as compound 8A.

Compounds 14A to 18A can be prepared according to the following scheme

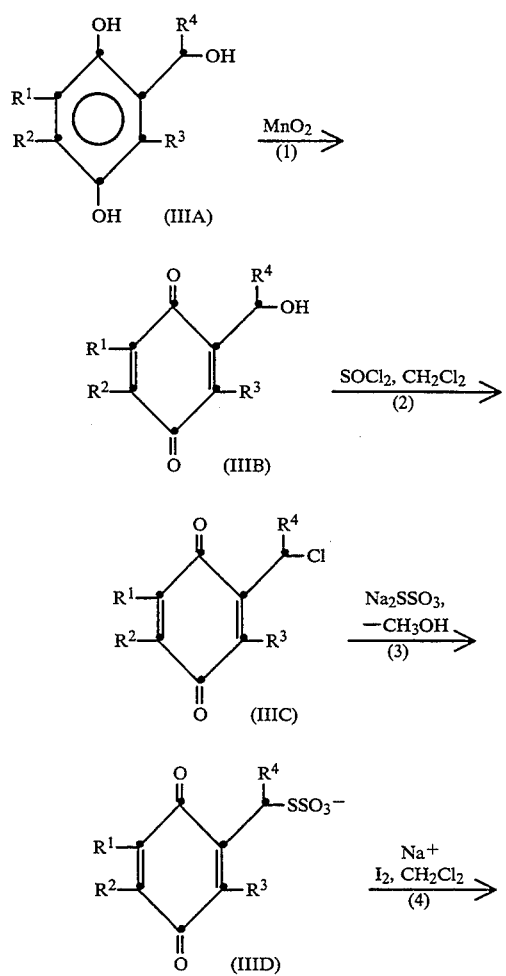

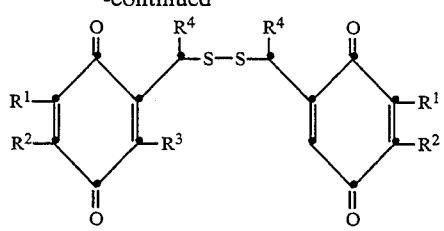

$R^1$, $R^2$, $R^3$ and $R^4$ have the same meaning as defined above If an assymmetric molecule is to be prepared a mixture of compounds (IIID) is used in step (4) of scheme (III). Compounds 10A to 13A may also prepared according to a variation of scheme (III) i.e. by reacting compounds of formula (IIID) in scheme (III) with compounds corresponding to $R^8$—$SSO_3^-$$Na^+$ wherein $R^8$ has the same meaning as defined above.

The procedure for preparing compounds 14A to 18A according to scheme (III) is exemplified for compound 14A of table 5 ($R^1$ and $R^2$ together forming a cyclohexane, $R^3$ being —$C_6H_5$-O-$C_{16}H_{33}$ and $R^4$ being $CH_3$) by the following procedure:

Preparation of compound (IIIB) of scheme (III).

To 52.4 g of compound (IIIA) (for preparation of (IIIA) see EP-A-109701) dissolved in 600 ml of ethyl acetate was added in portions 87 g of manganese dioxide. The suspension was reacted at reflux temperature for 1 hour. Next, the solid was filtered, and the filtrate was partly concentrated. Compound (IIIB) precipitated on cooling. The product was filtered and washed with cold ethyl acetate. The yield was 44 g (84%) and the melting point was 87%.

Preparation of compound (IIIC) of scheme (III)

To 25.6 g of compound (IIIB) dissolved in i 1 l of methylene chloride was added 64 g of thionyl chloride in 185 ml of methylene chloride, The reaction was slightly exothermic and the temperature was kept at 25° C. After the mixture was reacted for 4 hours the solvent was evaporated, The oily residue was dissolved in toluene and again concentrated. Finally the residue was reacted with 700 ml of ethanol. After 15 minutes a yellow solid seperated which was washed with ethanol and dried. The yield was 229 g (86%) and the melting point was 66° C.

Preparation of Compound (IIID) of Scheme (III)

To a suspension of 15 g of sodium thiosulphate in 40 ml water and 120 ml of methanol was added 54 g of compound (IIIC). The mixture was refluxed for 4 hours. An oily layer separated. The upper layer was removed and the oil was dissolved in 1200 ml of hexane. An orange-yellow precipitate seperated after 1 hour. The product was filtered and dried. The yield was 39 g (64%), and the melting point was 102.6° C.

Preparation of compound 14A of table 5.

To a solution of 55 g of compound (IIID) in 850 ml of methanol and 250 ml of water at 65° C. was added over a period of 40 minutes a solution of 11 g of iodine in 425 ml of methanol. The product separated as an oily residue. After chromatographical purification two diastereoisomers were obtained (Solid phase: $SiO_2$; eluent: hexane/methylenechloride 7/3). The respective yields were 21.8 g (46 %) and 17.2 g (37 %).

Compounds 19A and 20A can be prepared by reacting the reaction product of step (2) in scheme (III) with p-dihydroxybenzyldisulphide. A similar procedure is followed for compound 21A and is examplified by the following preparation:

Preparation of sodium S-(p-hydroxybenzyl)-thiosulfate

To a solution of 48 g of sodium S-(p-acetoxybenzyl)-thiosulfate (see J.O.C. 43, 1197, (1978)) in 120 ml of methanol and 40 ml of water was added 10 ml of HCl (1N). The reaction mixture was stirred at 50° C. for 4 hours. After standing overnight a voluminous precipitate was obtained. The precipitate was collected by filtration and dried. The yield was 18.8 g (46%). The melting point was 265° C.

Preparation of bis(p-hydroxybenzyl)disulfide

To a solution of 60.5 g sodium S-(p-hydroxybenzyl)-thiosulfate in 1000 ml of water was added 100 ml of $H_2SO_4$ (5M) and 100 ml of $H_2O_2$ (35%). The formed precipitate was filtered, washed with 200 ml of $H_2O$ and dried. The yield was 23.9 g (34%) and the melting point was 171° C.

Preparation of compound 21A 82.6 g of the ethylester of pivaloylacetic acid and 66 g of the ethylester of 4-aminobenzoic acid were dissolved in 200 ml of xylene. To this solution was added 0.4 ml of lutidine. The mixture was then refluxed for 8 hours. Ethanol which was formed during the reaction was removed by distillation. After cooling the reaction mixture was diluted with 1 l of hexane while stirring. A white precipitate was formed which was isolated by filtration and subsequently dried. The precipitate was identified as α-pivaloyl-(p-carbethoxy)-acetanilide having a melting point of 82°–85° C. The yield was 106 g.

To a solution of 29.1 g of α-pivaloyl-(p-carbethoxy)-acetanilide in 150 ml of dichloromethane was dropwise added during 30 min. 8.4 ml of sulfuryl chloride. The reaction mixture was then stirred for 9 hours at room temperature and the solvent was subsequently removed under reduced pressure. The obtained oil was stirred with hexane and a white precipitate was obtained which was filtered and dried. 31 g of α-chloro, α-pivaloyl-(4-carbethoxyacetanilide were thus obtained. The melting point was 90° C.

15.6 g of α-chloro, α-pivaloyl-(4-carbethoxyacetanilide, 5.56 g of p-dihydroxybenzyldisulphide and 10 ml of tetramethyl guanidine were dissolved in 120 ml of acetonitrile. A yellow solution was obtained that was stirred for 24 hours at room temperature. The reaction mixture was subsequently acidified with 8 ml of a 5M solution of HCl and diluted with 130 ml of water. An oil was formed which was isolated by extraction with dichloromethane. After removal of the dichloromethane under reduced pressure a yellow oil is obtained that was chromatographically purified. The yield was 7.9 g and the melting point was 60°–70° C.

The sensitizer releasing compounds used in accordance with the present invention may be present in one or more layers on the side of the support carrying the photosensitive silver halide. Preferably the sensitizer releasing compound is present in the layer containing the photosensitive silver halide. The amount of releasing compound(s) comprised in the photographic material may be varied widely but is preferably between 0.1 mmol/m² and 1 mmol/m².

The photosensitive and substantially light insensitive silver salt particles used in accordance with the present invention may be present in one or in separate layers. When they are present in separate layers the order of both layers may be varied as desired with respect to the support and intermediate water permeable layers of e.g. gelatin may be provided. Preferably the photosensitive and substantially light insensitive silver salt are present in the same layer.

To take advantage of the present invention it is important that the substantially light insensitive silver salt particles have a speed at least a factor 10 preferably a factor 100 less than the photosensitive silver halide used under the same conditions of development and exposure of the photosensitive silver halide. If the difference in speed is less than a factor 10 the substantially light insensitive silver salts will be rendered developable by the exposure of the imaging element which should be avoided as much as possible to take most advantage of the present invention.

Preferred substantially light insensitive silver salts used in accordance with the present invention are water insoluble silver salts e.g. a silver halide, bromate, molybdate, oxalate, chromate, iodate, isocyanate, thioisocyanate, cyanide, citrate, phosphate, oxide etc. Said substantially light insensitive water insoluble silver salts may be prepared using the precipitation reaction of the water soluble salt of the desired anion of the insoluble silver salt with a water soluble silver salt, e.g. silver nitrate, in the presence of a hydrophilic binder. Silver halides containing at least 70 mol% of chloride are preferred in the present invention for use as the substantially light insensitive silver salt particles.

As already metioned above the substantially light insensitive silver halide particles are preferably fine particles i.e. having a diameter of less than 0.5 μm. The silver halide is preferably also doped with $Rh^{3+}$, $Ir^{4+}$, $Cd^{2+}$, $Zn^{2+}$ and/or $Pb^{2+}$ to reduce the light sensitivity of the silver salt. The silver halide preferably is not chemically sensitized nor spectrally sensitized i.e. a so called primitive silver halide emulsion. The silver salt particles may further be desensitized on the surface with a desensitizing agent well known to those skilled in the art. Examples of desensitizing agents are disclosed in e.g. the U.S. Pat. Nos. 2,930,644, 3,431,111, 3,492,123, 3,501,310, 3,501,311, 3,574,629, 3,579,345, 3,598,595, 3,592,653, 4,820,625, 3,933,498, and GB 1,192,384. Further desensitizing agents suitable for use in accordance with the present invention are described e.g. by P. Glafkides in "Chimie et Physique Photographique", Paul Montel, Paris (1967). Agents that retard the dissolution of silver salt particles by a silver halide solvent may also be added. For example 5-nitro-indazole, ballasted mercapto-heterocyclic compounds etc. can be used for this purpose.

The photosensitive silver halide emulsion can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photosensitive silver halide emulsion used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The photosensitive silver halide particles of the photographic material used according to the present invention may have a regular crystalline form such as a cubic or octahedral form or they may have a transition form.

They may also have an irregular crystalline form such as a spherical form or a tabular form, or may otherwise have a composite crystal form comprising a mixture of said regular and irregular crystalline forms.

According to the present invention the photosensitive silver halide emulsion preferably consists principally of silver chloride while a fraction of silver bromide is present ranging from 1 mole % to 40 mole %. However other silver halide compositions can also be used in accordance with the present invention. The silver halide may be of the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the photosensitive silver halide grains may be varied widely but preferably is between 0.2 and 5 μm, most preferably between 0.3 and 2 μm. The photosensitive silver halide particles are preferably of high speed. It is furthermore advantageous that the photosensitive silver halide particles show a rapid chemical development i.e. silver halide emulsions that show a complete chemical development within at least 15 s. The rate of chemical development can be easily determined with the following method. The silver halide emulsion layer of which the rate of chemical development is to be measured is coated to a transparent support in an amount equivalent to 2 g of $AgNO_3/m^2$ and 2.1 g of gelatin/$m^2$. The thus obtained element is exposed to a suitable light-source and subsequently placed in a cuvette in a spectrophotometer and thermostated at 25° C. A developing solution is brought in the cuvette and the absorption at 800 nm is followed with time. From the plot of the absorption at 800 nm against time the time necessary to obtain a complete development of the sample can be determined.

The size distribution of the silver halide particles of the photosensitive silver halide particles to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-4}$ mole per mole of $AgNO_3$. This results in the building in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The photosensitive silver halide emulsion can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The photosensitive silver halide emulsion of the photographic element of the present invention can be spectrally sensitized according to the spectral emission of the exposure source for which the photographic element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, holopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. A preferred green sensitizing dye in connection with the present invention is represented by the following chemical formula:

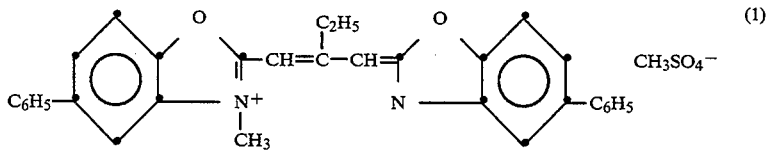

In case of exposure by a red light emitting source, e.g. a LED or a HeNe laser a red sensitizing dye is used. A preferred red sensitizing dye is:

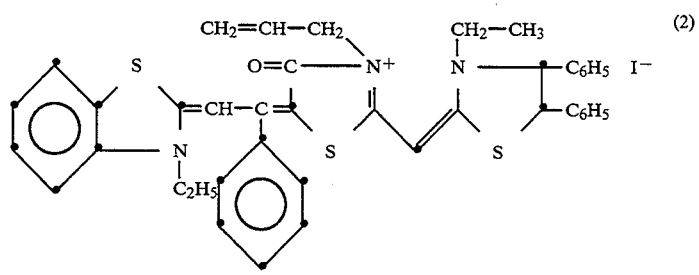

In case of exposure by an argon ion laser a blue sensitizing dye is incorporated. A preferred blue sensitizing dye is represented by:

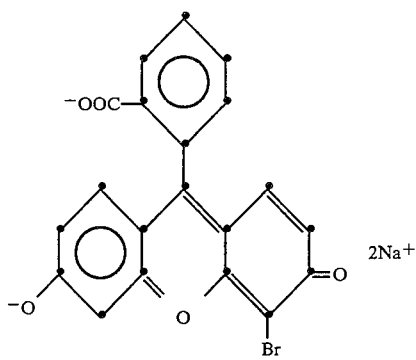

(3)

In case of exposure by a semiconductor laser special spectral sensitizing dyes suited for the near infra-red are required. Suitable infra-red sensitizing dyes are disclosed in i.a. U.S. Pat. Nos 2,095.854, 2,095,856, 2,955,939, 3,482,978, 3,552,974, 3,573,921, 3,582,344, 3,623,881 and 3,695,888. A preferred infra-red sensitizing dye is:

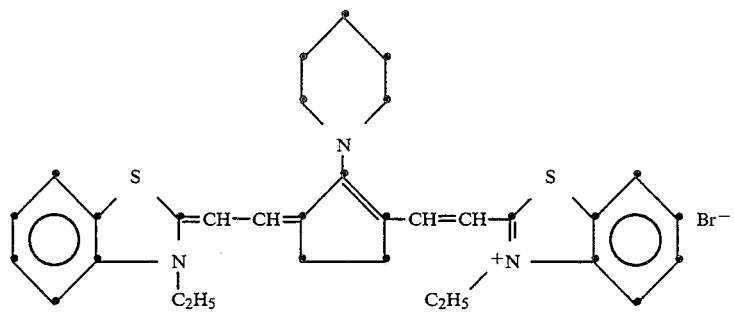

(4)

To enhance the sensitivity in the near infra-red region use can be made of so-called supersensitizers in combination with infra-red sensitizing dyes. Suitable supersensitizers are described in Research Disclosure Vol 289, May 1988, item 28952. A preferred supersensitizer is Compound IV of the Disclosure having following formula:

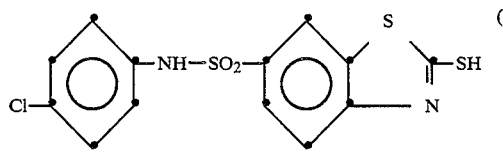

(5)

The spectral sensitizers can be added to the photosensitive silver halide emulsions in the form of an aqueous solution, a solution in an organic solvent or in the form of a dispersion.

The photosensitive silver halide emulsion and substantially light insensitive silver salt emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787, DE-P 2,453,217, and GB-P 7,907,440.

Development acceleration can be accomplished with the aid of various compounds, preferably polyalkylene derivatives having a molecular weight of at least 400 such as those described in e.g. U.S. Pat. Nos. 3,038,805; 4,038,075 and 4,292,400.

More details about the composition, preparation and coating of silver halide emulsions can be found in e.g. Product Licensing Index,, Vol. 92, December 1971, publication 9232, p. 107–109.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethyl hydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

In a preferred embodiment of the present invention an intermediate hydrophilic layer, serving as antihalation layer, is provided between the support and the photosensitive silver halide emulsion layer. This layer can contain the same light-absorbing dyes as described above for the emulsion layer; as alternative finely divided carbon black can be used for the same antihalation purposes as described in U.S. Pat. No. 2,327,828. On the other hand, in order to gain sensitivity, imagewise light reflecting pigments, e.g. titaniumdioxide can be present. Further this layer can contain hardening agents, matting agents, e.g. silica particles, and wetting agents. When the photosensitive silver halide and the substantially light insensitive silver salt are present in separate layers the antihalation layer can be provided between both silver salt layers.

The photographic element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic element of the present invention may further comprise various other additives such as e.g. compounds improving the dimensional stability of the photographic element, UV-absorbers, spacing agents or matting agents and plasticizers. Preferred spacing agents are $SiO_2$ particles having an average size of from 0.8 $\mu$m to 15 $\mu$m. These spacing agents may be present in one or more layers comprised on the support of the photographic material.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

According to the present invention there is provided a method for obtaining an image with the photographic material described above. According to this method the photographic material of the present invention is information-wise exposed and subsequently developed in the presence of developing agents. Suitable developing agents for the exposed silver halide are e.g. hydroquinone-type and 1-phenyl-3-pyrazolidone-type developing agents as well as p-monomethylaminophenol and derivatives thereof. Preferably used is a combination of a hydroquinone-type and 1-phenyl-3-pyrazolidone-type developing agent whereby the latter is preferably incorporated in one of the layers comprised on the support of the photographic material. A preferred class of 1-phenyl-3-pyrazolidone-type developing agents is disclosed in the European patent application number 449340. It was found that most advantage of the present invention is taken when at least one of the there disclosed developing agents are present in the photographic material of the present invention preferably in the layer(s) comprising the photosensitive and/or substantially light insensitive silver salt particles. Other type of developing agents suitable for use in accordance with the present invention are reductones e.g. ascorbic acid derivatives. Such type of developing agents are disclosed in the unpublished European patent application number 91200311.8.

The developing agent or a mixture of developing agents can be present in an alkaline processing solution and/or in the photographic material. In case the developing agent or a mixture of developing agents is contained in the photographic material, the processing solution can be merely an aqueous alkaline solution that initiates and activates the development.

The pH of the alkaline processing solution is preferably between 10 and 13. The desired pH of the processing solution can be reached by incorporating alkaline substances in the processing solution. Suitable alkaline substances are inorganic alkali e.g. sodium hydroxide, potassium carbonate or alkanolamines or mixtures thereof. Preferably used alkanolamines are tertiary alkanolamines e.g. those described in EP-A-397925, EP-A-397926, EP-A-397927, EP-A-398435 and U.S. Pat. No. 4.632.896. A combination of alkanolamines having both a $pk_a$ above or below 9 or a combination of alkanolamines whereof at least one has a $pk_a$ above 9 and another having a $pk_a$ of 9 or less may also be used as disclosed in the Japanese patent applications laid open to the public numbers 73949/61, 73953/61, 169841/61, 212670/60, 73950/61, 73952/61, 102644/61, 226647/63, 229453/63, U.S. Pat. No. 4,362,811, U.S. Pat. No. 4,568,634 etc. The concentration of these alkanolamines is preferably from 0.1 mol/l to 0.9 mol/l According to the present invention best results are obtained when the photographic element of the present invention is developed in the presence of a silver halide solvent. Preferably used silver halide solvents are water soluble thiosulphate compounds such as ammonium and sodium thiosulphate, or ammonium and alkali metal thiocyanates. Other useful silver halide solvents (or "complexing agents") are described in the book "The Theory of the Photographic Process" edited by T. H. James, 4th edition, p. 474–475 (1977), in particular sulphites and uracil. Further interesting silver halide complexing agents are cyclic imides, preferably combined with alkanolamines, as described in U.S. Pat. Nos. 4,297,430 and 4,355,090. 2-mercaptobenzoic acid derivatives are described as silver halide solvents in U.S. Pat.

No. 4,297,429, preferably combined with alkanolamines or with cyclic imides and alkanolamines. Dialkylmethylenedisulfones can also be used as silver halide solvent.

The silver halide solvent is preferably present in the processing solution but may also be present in one or more layers comprised on the support of the photographic element. When the silver halide solvent is incorporated in the photographic material it may be incorporated as a silver halide solvent precursor as disclosed in e.g. Japanese published unexamined patent applications no. 15247/59 and 271345/63, U.S. Pat. No. 4,693,955 and U.S. Pat. No. 3,685,991.

The processing solution for use in accordance with the present invention may comprise other additives such as e.g. thickeners, preservatives, detergents e.g. acetylenic detergents such as surfynol 104, surfynol 465, surfynol 440 etc. all available from Air Reduction Chemical Company New York.

The photographic material of the present invention can be used in a variety of application fields e.g. for producing images according to the DTR-process, for producing lithographic printing plates according to the DTR-process, for scanning exposure, in Computer Output to Microfilm (COM) applications etc. The use of the photographic material of the present invention in some of these application fields will be described in more detail in the following embodiments.

According to a first application the photographic material of the present invention can be used in a DTR-process to produce negative or positive images. The principles of the silver complex diffusion transfer reversal process have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an image-wise exposed photographic silver halide emulsion layer material is transformed with a silver halide solvent into soluble silver complex compounds which are allowed to diffuse into an image-receiving layer and are reduced therein with a developing agent, generally in the presence of physical development nuclei, to form a silver image having reversed image density values with respect to the silver image obtained in the exposed photographic material.

The DTR-process was initially intended for office copying purposes but has found now wide application in the graphic art field, more particularly in the production of screened prints from continuous tone originals. For processing DTR-materials according to the present embodiment use can be made of processing solutions described above provided of course that a silver halide solvent of the type described is present in the processing solution and/or in one or more layers of the DTR-material e.g. the image-receiving layer. When the silver halide solvent is incorporated in the photographic material it may be incorporated as a silver halide solvent precursor as disclosed in e.g. Japanese published unexamined patent applications no. 15247/59 and 271345/63, U.S. Pat. No. 4,693,955 and U.S. Pat. No. 3,685,991. When fairly low gradation images for continuous tone reproduction have to be produced preference is given to developing agent combinations as described in U.S. Pat. Nos. 3,985,561 and 4,242,436.

Processing of the DTR-material according to the present invention is preferably carried out using a single processing solution. However the photographic material according to the present embodiment may also be processed using two processing solutions. In the latter case only the second processing liquid used to process contains a silver halide solvent(s).

The alkaline processing solution for use in accordance with this embodiment preferably contains (a) silver image toning agent(s) providing a neutral (black) image tone to the DTR-produced silver image in the image-receiving layer. A survey of suitable toning agents is given in the above mentioned book of André Rott and Edith Weyde, p. 61–65, preference being given to 1-phenyl-5-mercapto-tetrazole, tautomeric structures and derivatives thereof such as 1-(2,3-dimethylphenyl)-5-mercapto-tetrazole, 1-(3,4-dimethylcyclohexyl)-5-mercapto-tetrazole, 1-(4-methylphenyl)-5-mercapto-tetrazole, 1-(3-chloro-4-methylphenyl)-5-mercapto-tetrazole, 1-(3,4-dichlorophenyl)-5-mercapto-tetrazole. Other suitable black toning agents for use in accordance with the present embodiment are those disclosed in the European patent applications 218752, 208346, 218753 and U.S. Pat. No. 4683189.

For DTR-processing the aqueous alkaline processing solution may comprise (a) toning agent(s) in a concentration in a range e.g. from 30 mg to 200 mg per liter. Said toning agents may also at least partially be present in the image receiving layer and/or in a layer in water permeable relationship therewith.

Other additives for the processing solution are thickening agents, e.g. hydroxyethylcellulose and carboxymethylcellulose, fog inhibiting agents, e.g. potassium bromide, potassium iodide and a benzotriazole, calcium-sequestering compounds, wetting agents, e.g. block copolymers of ethyleneoxide or of propylene oxide, anti-sludge agents, and hardeners including latent hardeners.

The DTR-image can be formed in the image-receiving layer of a sheet or web material being a separate element with respect to the photographic silver halide emulsion material or in a so-called single-support-element, also called mono-sheet element or unitary DTR-material, which contains at least one photographic silver halide emulsion layer and the image-receiving layer in water permeable relationship therewith, e.g. on top of each other or separated by a thin water permeable stripping layer or alkali-degradable interlayer as described e.g. in U.S. Pat. No. 3,684,508 or wherein the photographic silver halide emulsion layer is optically masked from the image-receiving layer, e.g. with a white water permeable pigment layer as described e.g. in U.S. Pat. Nos. 3,607,270 and 3,740,220.

When the DTR-image is formed on a separate sheet called image receiving material the information-wise exposed photographic material is processed in the processing liquid while in contact with said receiving material. Alternatively the processing liquid may be applied to either the image-receiving material or photographic material before contacting both elements. Both elements are usually kept in contact with each other for 30 s to 1 min.

The support of the image receiving material and/or photographic material may be opaque or transparent, e.g. a paper support or resin support. The image receiving layer comprises for best imaging results physical development nuclei normally in the presence of a protective hydrophilic colloid, e.g. gelatin, polyvinyl alcohol, polyvinyl pyrrolidone, poly(meth)acryl amide etc. or mixtures thereof, and/or colloidal silica.

Preferred development nuclei are sulphides of heavy metals e.g. sulphides of antimony, bismuth, cadmium, cobalt, lead, nickel, palladium, platinum, silver, and zinc. Especially suitable development nuclei are NiS-.Ag$_2$S nuclei as described in U.S. Pat. No. 4,563,410. Other suitable development nuclei are salts such as e.g. selenides, polyselenides, polysulphides, mercaptans, and tin (II) halides. Heavy metals or salts thereof and fogged silver halide are suitable as well. The complex salts of lead and zinc sulphides are active both alone and when mixed with thioacetamide, dithiobiuret, and dithiooxamide. Heavy metals, preferably silver, gold, platinum, palladium, and mercury can be used in colloidal form.

Most of the DTR-image receiving materials now available on the market are composed of two or even three layers. Such materials normally contain on top of the nuclei containing layer a layer which itself contains no nuclei and otherwise has the same composition as the nuclei containing layer and mainly serves to ensure good contact between the light sensitive and image receiving material during transfer. Moreover, after drying this layer provides a protective coating for the image receiving layer containing the silver image. It further prevents bronzing or plumming of the black image areas in preventing the protruding of silver from the image receiving layer in the form of a glossy silver mirror (ref. the above mentioned book p. 50).

According to a preferred mode of the present embodiment in the image-receiving element the development nuclei containing layer and/or hydrophilic colloid layer in water permeable relationship or a back layer at the side of the support opposite to that carrying the image receiving layer contains at least part of the silver image toning agents. Such procedure results actually in automatic replenishment of toning agent in the processing liquid. The same applies at least partly for the replenishment of the developing agent(s) and silver halide complexing agent(s).

At least a part of said silver image toning agents may be present in the silver halide emulsion material to be developed. Such means that in a practical embodiment at least one of the image toning agents may be used in a hydrophilic water permeable colloid layer, e.g. antihalation layer at the side of the support opposite to the side coated with the photosensitive silver halide emulsion layer or between the support and the silver halide emulsion layer. The coverage of said silver image toning agents in said antihalation layer is preferably in the range of 1 mg/m$^2$ to 20 mg/m$^2$.

Said layer at the side of the support opposite to the side coated with the photosensitive silver halide emulsion layer may also contain anti-sludge agents for reducing the contamination of the processing liquid. Suitable anti-sludge agents are disclosed in e.g. EP-223883, U.S. Pat. No. 3438777, BE-P-606550 and GB-P-1120963. Further anti-sludge agents suitable for use in accordance with the present invention correspond to the following general formula:

R—SH wherein R represents an alkyl or alkylaryl group containing at least 7 carbons in a straight line.

The transfer behaviour of the complexed silver largely depends on the thickness of the image-receiving layer and the kind of binding agent or mixture of binding agents used in the nuclei containing layer. In order to obtain a sharp image with high spectral density the reduction of tile silver salts diffusing into the image receiving layer must take place rapidly before lateral diffusion becomes substantial. An image-receiving material satisfying said purpose is described in U.S. Pat. No. 4,859,566.

A white appearance of the image background even when a yellow stain would appear on storage is obtained by incorporation of optical brightening agents in the support, image-receiving layer and/or interlayer between the support and the image-receiving layer.

In the image-receiving layer and/or in an undercoat gelatin is used preferably as hydrophilic colloid. In these layer(s) gelatin is present preferably for at least 60% by weight and is optionally used in conjunction with an other hydrophilic colloid, e.g. polyvinyl alcohol, cellulose derivatives, preferably carboxymethyl cellulose, dextran, gallactomannans, alginic acid derivatives, e.g. alginic acid sodium salt and/or water soluble polyacrylamides.

The image-receiving layer and/or a hydrophilic colloid layer in water-permeable relationship therewith may comprise a silver halide developing agent and/or silver halide solvent, e.g. sodium thiosulphate in an amount of approximately 0.1 g to approximately 4 g per m$^2$.

The image-receiving layer or a hydrophilic colloid layer in water-permeable relationship therewith may comprise colloidal silica.

The image-receiving layer may contain as physical development accelerators, in operative contact with the developing nuclei, thioether compounds such as those described e.g. in DE-A-1,124,354; U.S. Pat. No. 4,013,471; U.S. Pat. No. 4,072,526; and in EP 26520.

When applying an optical brightening agent in the image-receiving material preference is given to an optical brightening agent that is inherently by its structure resistant to diffusion or is made resistant to diffusion by use in conjunction with another substance wherein it is dissolved or whereto it is adsorbed.

For example, to make an optical brightening agent resistant to diffusion one of the following techniques may be applied.

According to a first technique known from colour photography the optical brightening compound is substituted with a long chain aliphatic residue and ionomeric residue as is known in the synthesis of diffusion resistant colour couplers.

According to a second technique an optical brightening agent of the oleophilic type is incorporated in droplets of a water-immiscible solvent, so-called "oilformer", e.g. dibutylphthalate.

According to a third technique the optical brightening agent is used in conjunction with a polymeric hydrophilic colloid adsorber, a so-called trapping agent, e.g. poly-N-vinylpyrrolidinone as described e.g. in U.S. Pat. Nos. 3,650,752, 3,666,470 and 3,860,427 and published European patent application 0 106 690.

According to a fourth technique latex compositions are used wherein latex particles are loaded, i.e. contain in dissolved and/or adsorbed state an optical brightening agent as described e.g. in German Offenlegungsschrift (DE-OS) 1,597,467 and in US-P 4,388,403.

The image-receiving layer and/or other hydrophilic colloid layer of an image-receiving material used in a DTR-process according to the present embodiment may have been hardened to some extent to achieve enhanced mechanical strength. Appropriate hardening agents for hardening the natural and/or synthetic hydrophilic colloid binding agents in the image-receiving layer include e.g. formaldehyde, glyoxal, mucochloric acid, and chrome alum. Other suitable hardening agents for hardening the hydrophilic colloid binding agents in the image-receiving layer are vinylsulphonyl hardeners, e.g. as described in Research Disclosure 22,507 of Jan. 1983.

According to a second application the photographic material can be used for manufacturing a lithographic printing plate precursor and for manufacturing a printing plate using the DTR-process. A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

Todate on the market lithographic printing plates made according to the DTR-process are positive working lithographic printing plates i.e. the non-exposed areas of a negative working silver halide will correspond to the printing areas on the plate. Most originals used for making a lithographic printing plate require reversal of the image which would not be required with a negative working printing plate. Furthermore, since only the image-areas have to be exposed on a negative working lithographic printing plate time can be saved in the imaging of such a printing plate with a laser. As described above the present invention offers the possibility to obtain a negative working lithographic printing plate without loss of speed.

According to the method of the present invention for making a lithographic printing plate an imaging element containing a photosensitive silver halide and substantially insensitive silver halide having a speed at least a factor 10 less than said photosensitive silver halide and a releasing compound capable of releasing a sensitizer is information-wise exposed and developed in the presence of (a) developing agent(s) and (a) silver halide solvent(s) while in contact with an image receiving layer that may be contained on a separate support, a so-called two-sheet DTR-material or may be contained in the imaging element a so called monosheet DTR-material. Subsequent thereto the developed printing plate is preferably treated with a neutralization solution containing buffer substances to neutralize the alkaline plate after treatment with the developing liquid.

Normally in lithographic printing greasy inks are employed. So, to obtain good prints it is necessary that the difference in oleophilic and hydrophilic (oleophobic) properties of the image and background surface is sufficiently distinct so that when water and ink are applied during the printing process, the image will accept sufficient ink leaving the background clean.

Suitable methods to enhance the differentiation in ink acceptance between the hydrophobic silver image parts and the hydrophilic non-image parts are as follows. Use can be made of so-called hydrophobizing agents to improve the ink acceptance of the silver image parts and which can be present, depending on the case, in one of the normal processing solutions of the DTR process, or in a separate solution, a so-called lithographic fixer. For example, U.S. Pat. No. 3,776,728 describes i.a. developer solutions which contain a heterocyclic mercapto-compound, e.g. a 2-mercapto-1,3,4-oxadiazole derivative, as hydrophobizing agent. U.S. Pat. No. 4,563,410 describes hydrophobizing liquids containing one or more mercaptotriazole or mercaptotetrazole derivatives or mixtures thereof.

Another method of enhancing the hydrophobic character of the silver image that can be used in accordance with the present invention consists in maximizing the ratio of the amount of development nuclei to the amount of hydrophilic binder, e.g. gelatin, in the development nuclei containing surface layer where the DTR-image is formed. For example U.S. Pat. No. 3,728,114 describes a direct positive sheet suitable for producing an offset printing plate which contains in its surface layer at most 30% of a high molecular weight compound, e.g. gelatin, relative to the weight of the nuclei.

Two types of mono-sheet DTR lithographic printing plate precursors are known and can be used in accordance with the present invention. A first type of lithographic printing plate precursor comprises a hydrophilic support e.g. an anodized aluminium support provided with an image-receiving layer and a photosensitive silver halide emulsion, substantially light insensitive silver salt particles and a sensitizer releasing compound. This lithographic printing plate precursor is then imagewise exposed and developed according to the DTR-process. After said development the layers above the image-receiving layer are removed by rinsing with water so that the silver image formed in the image-receiving layer is exposed and can be used to print.

The second type of lithographic printing plate precursor comprises on a support a photosensitive silver halide emulsion layer, substantially light insensitive silver salts, a sensitizer releasing compound and an image receiving layer as the outermost layer. According to the method for obtaining a lithographic printing plate with this type of precursor said precursor is information-wise exposed and development according to DTR-process and the imaged lithographic printing plate precursor is used to print without separation of the now useless silver halide emulsion layer. Commercially available DTR materials according to this method which can be processed to lithographic printing plates are marketed e.g. by MITSUBISHI PAPER MILLS LTD under the trade name SILVERMASTER and by AGFA-GEVAERT N.V. under the trade name SUPERMASTER.

The image-receiving layer for use in accordance with the present embodiment is preferably a layer of physical development nuclei and which layer is preferably substantially free of binding agents. Physical development nuclei suitable for use in accordance with this embodiment are the physical development nuclei described above. Preferably used physical development nuclei are heavy metal sulphides e.g. palladium sulphide.

Suitable supports for the lithographic printing plate precursor are metal supports preferably aluminium or zinc, paper supports preferably polyethylene coated paper supports disclosed in e.g. Japanese patent no. 1.030.140, polyester film supports preferably polyethylene terephthalate.

Metal supports are especially suitable for lithographic printing plates according to the first type. For example an anodized aluminium foil can be provided with a layer containing physical development nuclei directly to the support. To this layer is then preferably applied a layer containing a non-proteinic hydrophilic film forming polymer, latex particles or mixtures thereof as disclosed in EP-A-90202900.8 and EP-A-410500. To the thus obtained element a layer containing the photosensitive silver halide particles, the substantially light insensitive silver salt particles and the releasing compound is finally applied. According to a variation the photosensitive silver halide particles and the substantially light insensitive silver salt particles can be present in separate layers the releasing compound then being present in one or both of these layers. The arrangement of these separate layers being preferably so that the layer containing the photosensitive silver halide particles is the remotest from the support. The releasing compound may also be present in other layers comprised on the photosensitive side of the support.

When a paper support or polyester film support is used the layer arrangement described above is reversed so that the physical development nuclei layer is the remotest from the support. A lithographic printing plate precursor of the second type described above is thus obtained.

In the past several developments that can be used in accordance with the present invention have taken place for improving the storage stability, printing properties, photographic properties etc. of these printing plates and/or printing plate precursors of the second type. It has been found advantageous with respect to storage stability to include developing agents of the hydroquinone type and of the 1-phenyl-3-pyrazolidone type in the photographic material in a ratio by weight of the hydroquinone type to the 1-phenyl-pyrazolidone type not more than 2.5 and preferably between 2.0 and 0.8.

Preferably the lithographic printing plate precursor also includes so called matting agent in a hydrophiblic base layer comprised between the support and the subsequent layers comprised on the support. The matting agent may also be included in other layer such as the layer(s) containing the photosensitive and/or substantially light insensitive silver salt particles but preferably at least 80% of the total amount is included in the base layer. Suitable matting agent for use in accordance with the present embodiment are organic or inorganic particles having an average size of 0.8 $\mu$m to 20 $\mu$m preferably between 2 $\mu$m and 10 $\mu$m. Mixtures of matting agents having different sizes may also be used. Examples of inorganic particles are $SiO_2$, $TiO_2$, $Al_2O_3$, clay etc. Examples of organic particles are latex particles of homopolymers and/or copolymers of (meth)acrylate.

With respect to the printing endurance it is further advantageous to include a hydrophilic colloid layer contiguous to the image-receiving layer. Especially good results are obtained when said hydrophilic colloid layer is used in accordance with the present invention. Said hydrophilic colloid layer is preferably gelatin. To increase the printing endurance it is also known to include a benztriazolein the lithographic printing plate precursor and/or the processing solution as disclosed in e.g. U.S. Pat. No. 4,824,760.

According to a third application of the present invention the photographic material can be used for preparing a positive working silver halide photographic material having a high speed. Such type of materials are commonly employed in COM-applications as well as in the graphic arts field. Todate positive working materials for use in COM-applications are based on direct positive silver halide emulsions. These type of silver halide emulsions are however less sensitive than negative silver halide emulsions.

Since it is possible according to the present invention to obtain a positive working photographic material with a negative photosensitive silver halide emulsion a high speed positive working photographic material can be obtained. For this purpose a support e.g. a paper or resin support is provided with a layer comprising a negative working photosensitive silver halide emulsion, substantially light insensitive silver salt particles and a releasing compound that is capable of releasing a chemical sensitizer mainly in the non-exposed areas. During development the chemical sensitizer will be released in the non-exposed areas where the chemical sensitizer causes the development of the substantially light insensitive and possibly the photosensitive silver salt. However in the exposed areas the photosensitive silver halide will also develop thus yielding a certain density in the exposed areas which is not desired. To decrease the density in the exposed areas the amount of photosensitive silver halide is kept as low as possible preferably below 0.5 g of $AgNO_3/m^2$ and the average grain size is preferably more than 0.4 $\mu$m. To further reduce the density in the exposed areas use can be made of compounds that release a development inhibitor in the exposed areas upon development. For example development inhibitor releasing compounds disclosed in e.g. EP-A-347849, the U.S. Pat. Nos. 3,148,062, 3,227,554, 3,733,201, 3,617,291, 3,980,479, 3,933,500, 4,248,962, 4,409,323 and 4,684,604 can be used.

Said development step is preferably followed by a washing step, a fixing step and another washing or stabilizing step. The first washing step may be omitted.

According to a variation of the present embodiment the photosensitive and substantially light insensitive silver salt particles are present in separate layers the preferred mode however being the above described mode.

According to a fourth application of the present invention a negative working photographic material may be prepared in a similar way as described in the third embodiment with the difference however that a releasing compound is comprised in the photographic material that releases a chemical sensitizer during development mainly in the exposed areas of the negative working photosensitive silver halide.

The present invention will now be illustrated with the following examples without limiting the present invention thereto. All parts are by weight unless otherwise specified. The sizes of the silver halide grains mentioned in these examples is expressed as the average diameter of all silver halide grains. By the diameter of a silver halide grain is meant the diameter of a hypothetical sphere with an equivalent volume as the corresponding silver halide grain.

EXAMPLE 1

Preparation of the substantially light insensitive silver halide emulsion.

| Solution A (40° C.) | water | 1000 ml |
|---|---|---|
| | AgNO3 | 332 g |
| Solution B (40° C.) | water | 100 ml |
| | NaCl | 42.3 g |
| Solution C (40° C.) | water | 900 ml |
| | KBr | 5.6 g |

| | | |
|---|---|---|
| Solution D (40° C.) | NaCl | 377 g |
| | gelatin | 50 g |

Solution D was brought to pH 4.0 with a sulfuric acid solution and to a pAg of 105 mV with a sodium chloride solution. Subsequently solution A was added at a constant rate, while solution B was added at a rate so as to keep the pAg at 105 mV. Solution A was further added at an accelerating rate, while solution C was added at a rate sufficient to keep the pAg constant. The resulting silver halide emulsion was precipitated by adding polystyrene sulphonic acid. The precipitate was rinsed several times and redispersed by adding 180 g of gelatin per 2.2 kg of precipitate. A substantially light insensitive silver halide emulsion containing 99 mol% of silver chloride and 1 mol% of silver bromide was thus obtained. The average grain size was 0.155 µm.

Preparation of the photosensitive silver halide emulsion.

| | | |
|---|---|---|
| Solution E (20° C.) | AgNO$_3$ | 1.7 g |
| | water | 1000 ml |
| Solution F (20° C.) | water | 250 ml |
| | NaCl | 11,3 g |
| Solution G (40° C.) | water | 995 ml |
| | AgNO$_3$ | 33 g |
| Solution H (40° C.) | water | 1250 ml |
| | NaCl | 668 g |
| | KBr | 4,4 g |
| | H$_2$SO$_4$ (1N) | 47.5 ml |
| Solution I (58° C.) | NaCl | 5.66 g |
| | gelatin | 90 g |
| | H$_2$SO$_4$ (1N) | 24 ml |
| | water | 2500 ml |

Solution E and F were simultaneously added to solution I in 3 min. After 10 min. 42 µg rhodium(III)hexachloride was added. Solution G was then added to solution I in 5 min. and subsequently solution H was added to solution I in 8 min. Physical ripening was carried out for 40 min. at 65° C., whereafter 0,6 ml of a potassium iodide solution (3mol/l ) were added. The silver halide emulsion was subsequently ripened with gold and thiosulphate and precipitated with polystyrene sulphonic acid. After washing the silver halide emulsion was stabilized with triazaindolizine and redispersed with 160 g of gelatin per 566 kg of silver expressed as AgNO$_3$. The silver halide emulsion was then spectrally sensitized with an ortho sensitizer. A silver halide emulsion with a composition of 98.5% AgCl, 1.3% AgBr and 0.2% AgI was obtained with an average grain size of 0.41 µm.

Preparation of a lithographic printing plate precursor.

To a polyethylene terephthalate film support coated with a hydrophilic adhesion layer was coated a layer containing a mixture of the above described photosensitive silver halide emulsion and the above described substantially light insensitive silver halide emulsion in a total amount of silver halide corresponding to 2.8 g AgNO$_3$/m$^2$. 18% of the total amount of AgNO$_3$ in the layer corresponded to the photosensitive silver halide. This layer further contained 0.446 mmol/m$^2$ of hydroquinone, 0.34 mmol/m$^2$ of a 1-phenyl-3-pyrazolidone and a dispersion of compound 14A of table 5 in an amount of 0.467 mmol/m$^2$. To the thus obtained element was then applied a finishing layer of gelatin in an amount of 0.6 g gelatin per m$^2$ and a layer of PdS physical development nuclei.

Preparation of the lithographic printing plate.

The thus obtained lithographic printing plate precursor was image-wise exposed through a negative original for 1.3 s with a halogen light source and subsequently processed as follows:

15 s in an activator solution with the following composition:

| | |
|---|---|
| cyclohexanedimethylol | 25 g/l |
| methylpropylpropaandiol | 25 g/l |
| Na$_2$CO$_3$ | 14 g/l |
| NaOH | 70,9 g/l |

30 s in a transfer developer with the following composition:

| | |
|---|---|
| NaOH | 30 g/l |
| hydroquinone | 13 g/l |
| 1-phenyl-4,4-dimethyl-3-pyrazolidone | 5 g/l |
| KSCN | 7 g/l |
| 5-heptyl-2-mercapto-1,3,4-oxadiazole | 0.5 g/l |

30 s in a stabilising liquid with the following composition:

| | |
|---|---|
| NaH$_2$PO$_4$.2H$_2$O | 60 g/l |
| Na$_2$HPO$_4$.12H$_2$O | 10 g/l |
| Na$_2$SO$_3$ | 5 g/l |
| Cysteine.HCl.H$_2$O | 1 g/l |
| Ammoniumperfluorocaprylate | 0.2 g/l |

The thus obtained printing plate was installed on an ABDIck 9850 printing press. Up to 10000 copies of good quality could be printed using ABDick 1020 ink and a conventional fountain solution.

EXAMPLE 2

An imaging element was prepared by coating a polyethyleneterephthalate film support coated with a hydrophilic adhesion layer with a layer containing a mixture of the photosensitive silver halide emulsion and the substantially light insensitive silver halide emulsion, both described in example 1, in a total amount of silver halide corresponding to 2.8 g AgNO$_3$/m$^2$. 18% of the total amount of AgNO$_3$ in the layer corresponded to the photosensitive silver halide. To the thus obtained element was coated a finishing layer of gelatin in an amount of 0.6 g gelatin per m$^2$.

The thus obtained imaging element was image-wise exposed through a negative original for 1.3 s with a halogen light source and subsequently processed with the activator solution (15 s) and the transfer developer (30 s) described in example 1. The transmission density obtained in the exposed areas was 0.5 and 2.6 in the non-exposed areas.

EXAMPLE 3

An imaging element was prepared as in example 2 with the exception however that the photosensitive silver halide emulsion was replaced with a silver halide emulsion containing 99.5 mol% AgCl and 0.5 mol% AgBr having a grain size of 0.6 µm. The latter silver halide emulsion was prepared in a similar way as in example 1. The amount of photosensitive silver halide emulsion in the layer was 12.6% of the total amount of silver halide expressed as AgNO$_3$.

The obtained imaging element was image-wise exposed and processed as in example 2 with the exception that 1-phenyl-4,4-dimethyl-3-pyrazolidone was omitted in the transfer developer. The transmission density obtained in the exposed area was 3.1 and 0.33 in the non-exposed areas.

A similar image-wise exposed imaging element could also be processed 25 using a single processing bath with the following composition:

| | |
|---|---|
| cyclohexanedimethylol | 25 g/l |
| methylpropylpropaandiol | 25 g/l |
| Na$_2$CO$_3$ | 14 g/l |
| NaOH | 70.9 g/l |
| Na$_2$SO$_3$ | 30 g/l |
| 1-hydroxymethyl-5,5-dimethylhydantoine | 16 g/l |
| phenetyl-pyridinium chloride | 2 g/l |
| KSCN | 2 g/l |
| 5-heptyl-2-mercapto-1,3,4-oxadiazole | 0.15 g/l |
| hydroquinone | 4 g/l |

An image was obtained having a transmission density of 0.4 in the exposed areas and 2.12 in the non-exposed areas.

EXAMPLE 4

A photosensitive silver halide emulsion containing 2.7 mol% of AgBr and 97.3 mol% of AgCl was prepared using the double jet method. The average size of the silver halide particles was 1.35 μm.

A substantially light insensitive silver chloride emulsion was prepared according to the double jet method. The average size of the silver chloride particles was 0.086 μm. The silver chloride particles were doped with rhodium(III)chloride in an amount of 0.169 mmol per mol of AgNO$_3$ to reduce their speed.

A comparative imaging element was prepared by coating a mixture of this photosensitive and substantially light insensitive silver halide emulsion in a total amount of silver halide corresponding to 2.5 g AgNO$_3$/m$^2$ to a polyethylene terephthalate film support coated with a hydrophilic adhesion layer. The total amount of binder (gelatin) in this layer was 2.12 g/m$^2$. 20% of the total amount of AgNO$_3$ corresponded to photosensitive silver halide. This layer further contained 0.5 mmol/m$^2$ of a hydroquinone and 0.75 mmol/m$^2$ of a 1-phenyl-3-pyrazolidone. To the thus obtained element was coated a layer of gelatin in an amount of 0.5 g/m$^2$ containing 3 mmol/m$^2$ of a hydroquinone.

A second imaging element according to the invention was prepared similar to the comparative imaging element with the exception however that 0.5 mmol/m$^2$ of compound 14A mentioned in table 5 was incorporated in the layer containing the photosensitive silver halide.

The thus obtained imaging elements were information-wise exposed and subsequently developed with the following processing solution for 2 min.:

| | |
|---|---|
| sodium carbonate (anhydrous) | 14 g/l |
| sodium hydroxide | 69 g/l |
| uracil | 0.01 M | and finally fixated with a solution containing 138 g/l of a thiosulphate.

The transmission density measured in the exposed areas for the comparitive imaging element was 0.2 and 0.09 in the non-exposed areas. The imaging element according to the invention yielded a density value of 0.4 in the exposed areas and 2.5 in the non-exposed areas.

An information-wise exposed imaging element according to the invention as described in this example was developed with the following processing solution for 30 s:

| | |
|---|---|
| sodium carbonate (anhydrous) | 14 g/l |
| sodium hydroxide | 69 g/l |
| uracil | 0.05 M |
| hydroquinone | 4.33 g/l |
| 1-phenyl-3-pyrazolidone | 1.57 g/l | and fixed with a solution containing 138 g/l of a thiosulphate.

The density measured in the exposed areas was 0.13 and 1.45 in the non-exposed areas.

EXAMPLE 5

A photosensitive silver halide emulsion containing 2.7 mol% of AgBr and 97.3 mol% of AgCl was prepared using the double jet method. The average size of the silver halide particles was 1.08 μm.

A substantially light insensitive silver chloride emulsion was prepared according to the double jet method. The average size of the silver chloride particles was 0.091 μm. The silver chloride particles were doped with rhodium(III)chloride in an amount of 160 ppm to reduce their speed.

An imaging element was prepared by coating a mixture of the above described photosensitive and substantially light insensitive silver halide emulsion in a total amount of silver halide corresponding to 2.24 g of AgNO$_3$/m$^2$ to a polyethylene terephthalate film support coated with a hydrophilic adhesion layer. The total amount of gelatin in this layer was 2.21 g/m$^2$ and 10.7% of the total amount of AgNO$_3$ corresponded to photosensitive silver halide. The layer further contained 0.7 mmol of compound 21A mentioned above.

A comparative imaging element was prepared similar to the above described imaging element with the exception however that compound 21A was left out.

The thus obtained imaging elements were information-wise exposed and subsequently developed during 1min. at room temperature in a developing liquid having the following composition and fixed using a fixing solution containing thiosulphate (G333 commercially available from Agfa-Gevaert N.V.).

| | Composition of developing liquid |
|---|---|
| KBr | 0.8 g/l |
| benzylalcohol | 12 g/l |
| sodium carbonate | 50 g/l |
| glycol | 50 g/l |
| 1-phenyl-3-pyrazolidone | 0.25 g/l |
| p-phenylenediamine | 7.5 g/l |
| sodium sulphite | 5 g/l |
| uracil | 2.24 g/l |
| sodium hydroxide | to adjust to pH = 11.5 |

The transmission density of the comparitive imaging element was 0.08 in the exposed areas and 0.06 in the non-exposed areas while the density of the imaging element according to the invention was 0.48 in the exposed areas and 0.06 in the non-exposed areas. Furthermore for the comparitive imaging element it was found that 7% and 1% of the total amount of silver halide was developed in respectively the exposed and non-exposed areas while the imaging element according to the invention showed that respectively 74% and 5% of the total amount of silver halide were developed.

The present example thus shows that when a sensitizer releasing compound according to the invention is used an image with good differentiation between exposed and non-exposed parts can be obtained without reversal of the image values.

EXAMPLE 6

An imaging element was prepared, exposed and processed as described in example 5 with the exception however that compound 9A mentioned above was used instead of compound 21A. The amount of silver halide developed in the exposed and non-exposed areas was respectively 87% and 4%. The density in the exposed and non-exposed areas was respectively 0.7 and 0.06.

EXAMPLE 7

A photosensitive silver halide emulsion containing 2.7 mol% of AgBr and 97.3 mol% of AgCl was prepared using the double jet method. The average size of the silver halide particles was 0.77 μm.

A substantially light insensitive silver chloride emulsion was prepared according to the double jet method. The average size of the silver chloride particles was 0,094 μm. The silver chloride particles were doped with rhodium(III)chloride in an amount of 0,140 mmol per mol of $AgNO_3$ to reduce their speed and stabilized with a phenyl mercaptotetrazole derivative.

An imaging element was prepared by coating a mixture of this photosensitive and substantially light insensitive silver halide emulsion in a total amount of silver halide corresponding to 1.96 g $AgNO_3/m^2$ to a polyethylene terephthalate film support coated with a hydrophilic adhesion layer. The total amount of binder (gelatin) in this layer was 1.87 $g/m^2$. 18% of the total amount of $AgNO_3$ corresponded to photosensitive silver halide. This layer further contained 0.6mmol/$m^2$ of a hydroquinone and 0.4 mmol/$m^2$ of a 1-phenyl-3-pyrazolidone and 0.6mmol/$m^2$ of compound 2A mentioned in table 5. To the thus obtained element was coated a layer of gelatin in an amount of 0.5 $g/m^2$.

The thus obtained imaging element was informationwise exposed and subsequently developed with the following processing solution for 35 s:

| | |
|---|---|
| sodium sulphite (anhydrous) | 35 g/l |
| potassium bromide | 0.82 g/l |
| hydroquinone monosulphonate | 13 g/l |
| 1-phenyl-3-pyrazolidone | 4 g/l |
| sodium thiosulfate (anhydrous) | 0.82 g/l |
| methylethanolamine | 12 ml/l |
| sodium hydroxide | 10 g/l |
| 1-phenyl-5-mercaptotetrazole | 0.15 g/l |
| 3,4-dichloro-1-phenyl-5-mercaptotetrazole | 0.01 g/l |

The imaging element was then processed for 30 s in an aqueous solution containing 20% of acetic acid and finally fixated with a solution containing 138 g/l of a thiosulphate.

The transmission density measured in the exposed areas of the imaging element was 0.24 and 3.06 in the non-exposed areas.

We claim:

1. A photographic material comprising on a support (i) photosensitive silver halide particles, (ii) substantially light insensitive silver salt particles having a speed at least a factor 10 less than said photosensitive silver halide particles under the same conditions of exposure and development of said photosensitive silver halide particles, and (iii) a releasing compound capable of image-wise releasing under the conditions for image-wise development of said photosensitive silver halide to silver a chemical sensitizer, said chemical sensitizer rendering said substantially light insensitive silver salt particles developable and corresponding to one of the following formulas (A) or (B):

$$CAR-(TIME)_n-Q \qquad (A)$$

wherein CAR represents a carrier moiety that upon reaction with either the reduced or oxidized form of a developing agent or upon reaction with silver ions is capable of releasing under the conditions for development of the photosensitive silver halide the moiety —(-TIME)$_n$—Q, TIME represents a timing group which releases Q subsequent to the release of —(TIME)$_n$—Q from CAR and Q represents $$-Y_x-(TIME)_t-CAR', \;\; -Y_x-R^8 \text{ or}$$
$$-S-SO_2-R^8$$

wherein n represents 0 or 1, x represents an integer from 2 to 20, Y represents S, Se or Te, t is 0 or 1, and CAR' has one of the significance given for CAR and may be the same as CAR but may also differ from CAR provided that both CAR and CAR' react in the same manner and $R^8$ represents an alkyl, alkylaryl, aryl or acyl group that may be substituted;

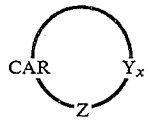

(B)

wherein Y and x have the same meaning as defined in formula (A), and Z represents the necessary atoms to form together with $Y_x$ and CAR a ring.

2. A photographic material according to claim 1, wherein said substantially light insensitive silver salt particles are silver halide particles.

3. A photographic material according to claim 1 wherein said releasing compound is capable of releasing under the conditions of development of said photosensitive silver halide to silver said chemical sensitizer upon cross-oxidation or cross-reduction with a developing agent.

4. A photographic material according to claim 1 wherein said releasing compound is capable of releasing the chemical sensitizer under the conditions of development of said photosensitive silver halide to silver upon a coupling reaction with the oxidized form of a developing agent.

5. A photographic material according to claim 1 wherein said photosensitive silver halide particles and said substantially light insensitive silver salt particles are present in the same layer.

6. A photographic material according to claim 1 additionally comprising a layer of physical development nuclei.

* * * * *